US006822534B2

(12) United States Patent
Uriu et al.

(10) Patent No.: US 6,822,534 B2
(45) Date of Patent: Nov. 23, 2004

(54) LAMINATED ELECTRONIC COMPONENT, LAMINATED DUPLEXER AND COMMUNICATION DEVICE

(75) Inventors: Kazuhide Uriu, Katano (JP); Hiroyuki Nakamura, Katano (JP); Toru Yamada, Katano (JP); Tsutomu Matsumura, Yao (JP); Hiroshi Kagata, Hirakata (JP); Kouji Kawakita, Jyoyo (JP); Toshio Ishizaki, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/221,971

(22) PCT Filed: Mar. 14, 2001

(86) PCT No.: PCT/JP01/02002

§ 371 (c)(1),
(2), (4) Date: Jan. 10, 2003

(87) PCT Pub. No.: WO01/69710

PCT Pub. Date: Sep. 20, 2001

(65) Prior Publication Data

US 2003/0147197 A1 Aug. 7, 2003

(30) Foreign Application Priority Data

Mar. 15, 2000 (JP) ....................................... 2000-072830
Mar. 15, 2000 (JP) ....................................... 2000-072831
Mar. 15, 2000 (JP) ....................................... 2000-072832

(51) Int. Cl.$^7$ ................................................ H03H 7/01
(52) U.S. Cl. ........................ 333/185; 333/175; 333/204
(58) Field of Search ................................ 333/184, 185, 333/204, 205, 175, 176, 177

(56) References Cited

U.S. PATENT DOCUMENTS 5,369,379 A 11/1994 Fujiki ......................... 333/116
5,668,511 A 9/1997 Furutani et al. ............ 333/204
5,777,533 A * 7/1998 Kato et al. ................... 333/185
6,587,020 B2 * 7/2003 Tojyo .......................... 333/185
6,608,538 B2 * 8/2003 Wang .......................... 333/204

FOREIGN PATENT DOCUMENTS

| | | | |
|---|---|---|---|
| JP | 05-275003 | 10/1993 | ........... H01P/1/203 |
| JP | 05-283906 | 10/1993 | ........... H01P/1/203 |
| JP | 07-273502 | 10/1995 | ........... H01P/1/203 |
| JP | 09-93005 | 4/1997 | ............. H01P/3/18 |
| JP | 09-307320 | 11/1997 | ............. H01P/7/08 |
| JP | 2817487 | 8/1999 | ............. H01P/5/18 |

OTHER PUBLICATIONS

Japanese search report for PCT JP01 02002 dated Jun. 26, 2001.

English translation of Form PCT ISA 210.

* cited by examiner

*Primary Examiner*—Robert Pascal
*Assistant Examiner*—Dean Takaoka
(74) *Attorney, Agent, or Firm*—RatnerPrestia

(57) ABSTRACT

A laminated filter includes: a first dielectric layer having a first shield electrode on one principal plane; a second dielectric layer having resonator electrodes on one principal plane; a third dielectric layer having a coupling electrode provided facing part of the above-described resonator electrodes; a fourth dielectric layer having a second shield electrode on one principal plane; a fifth dielectric layer whose at least one principal plane is exposed outside; and a grounding electrode provided on the other principal plane of the above-described dielectric layer and/or the above-described one principal plane of the above-described fifth dielectric layer, and the above-described first grounding electrode and the above-described first shield electrode are electrically connected through a via hole provided in the above-described first dielectric layer.

41 Claims, 24 Drawing Sheets

LAMINATED ELECTRONIC COMPONENT, LAMINATED DUPLEXER AND COMMUNICATION DEVICE

This Application is a U.S. NATIONAL PHASE APPLICATION OF PCT INTERNATIONAL APPLICATION PCT/JP01/02002.

TECHNICAL FIELD

The present invention relates to a laminated electronic component, a laminated duplexer and a communication device mainly mounted on a high frequency radio device such as a cellular phone.

BACKGROUND ART

With miniaturization of communication devices, laminated electronic components are being used as high frequency devices in recent years. With reference to the attached drawings, an example of the above-described conventional laminated electronic component will be explained below.

FIG. 3 shows an exploded perspective view of a conventional electronic part. As shown in FIG. 3, the laminated electronic component comprises dielectric layer 301 to dielectric layer 308 placed one atop another. A grounding electrode 309 is placed on the dielectric layer 301 and capacitor electrode 310 is placed on the dielectric layer 302. Furthermore, strip lines 311 and 312 are placed on the dielectric layer 303 and connected at a connection point 313.

A capacitor electrode 314, a grounding electrode 315, a capacitor electrode 316 and a grounding electrode 317 are placed on dielectric layers 304, 305, 306 and 307, respectively. Furthermore, the capacitor electrode 310 is connected to a connection point 318 of the strip line 311 via a via hole 322 and the capacitor electrode 314 is connected to the connection point 313 via a via hole 323. Furthermore, the capacitor electrode 316 is connected to a connection point 319 of the strip line 312 via a via hole 324.

The grounding electrodes 315 and 317 are connected to the grounding electrode 309 via an external electrode 320 formed on one side of the laminated electronic component, and the external electrode terminals of the circuit form an input electrode and output electrode by extending one end of the strip lines 311 and 312 to the end face of the laminated electronic component and connecting them to the external electrode 321 formed on the sides of the laminated electronic component. However, for simplicity of explanations, the positions of the via holes in the figure are schematically shown with dotted line on the exploded perspective view in principle.

Then, FIG. 23 shows another example of a perspective view of a conventional laminated electronic component.

In FIG. 23, the laminated electronic component 3901 is constructed of a laminated body 3902 formed of a plurality of laminated dielectric sheets and external electrodes 3903. The inner layer of the laminated body 3902 contains at least one inner circuit (not shown) provided with input/output terminals and at least one inner grounding electrode (not shown).

On at least one side of the laminated body 3902, the external electrodes 3903 are formed and these external electrodes 3903 are electrically connected to the input/output terminals of the inner circuit and the inner grounding electrode respectively. Here, suppose the one electrode connected to the input/output terminals of the inner circuit is an external electrode 3903*a* and the other electrode connected to the inner grounding electrode is an external electrode 3903*b*.

The external electrodes 3903*a* and 3903*b* are formed by applying a metal film to specific locations of the sides of the laminated body 3902 and all external electrodes are formed extending from the top surface to the bottom surface occupying a wide range of area.

However, in the case of the conventional configuration shown in FIG. 3, an input electrode, output electrode and grounding electrode exist as external electrodes on the sides of the laminated electronic component including a plurality of circuits, and therefore there is a plurality of external electrodes formed on the sides of the laminated electronic component, which reduces the area occupied by the grounding electrode. Therefore, it is not possible to secure a sufficient area for the grounding electrode with these external electrodes alone, causing a problem that electric grounding strength is weakened. The electric grounding strength means an electric grounding state and is also simply called grounding strength. Further, The ideal electric grounding state is the state where the electric potential is zero. Accordingly, "grounding strength is weak" means the state apart from the ideal grounding state, and "grounding strength is strong" means the state close to the ideal grounding state.

Here, the grounding electrode refers to an electrode to be connected to a predetermined grounding surface on a motherboard (not shown) on which the laminated electronic component is to be mounted by means of soldering, etc.

On the other hand, in the case of the conventional laminated electronic component shown in FIG. 23, the external electrode 3903*a* electrically connected to the input/output terminals of the inner circuit and the external electrode 3903*b* electrically connected to the inner grounding electrode have almost the same shape and are formed extending from the top surface to the bottom surface of the laminated body 3902 occupying a wide range of area.

For this reason, especially when the area of the external electrode 3903*a* electrically connected to the input/output terminals of the inner circuit is large, parasitic components such as a conductance component or inductance component are generated especially in the external electrode 3903*a* of these external electrodes 3903, leading to deterioration of characteristics when the device is used for a high frequency area.

Especially, when used as a laminated filter, etc. that handles an input signal of 1 GHz or greater, the above-described conventional laminated electronic component shown in FIG. 3 and FIG. 23 has the problem that the high frequency characteristic of the filter circuit, etc., that is, the characteristic of selecting frequencies in a high frequency area deteriorates.

DISCLOSURE OF THE INVENTION

The present invention has been achieved in view of these problems of the above-described conventional laminated electronic component and it is an object of the present invention to provide a laminated electronic component capable of sufficiently securing a grounding electrode and increasing the grounding strength.

Further, in view of these problems of the above-described conventional laminated electronic component, it is another object of the present invention to provide a laminated electronic component with an excellent characteristic of selecting frequencies in a high frequency area.

One aspect of the present invention is a laminated electronic component comprising:

a dielectric layer A provided with a first shield electrode on one principal plane;

a dielectric layer C which is a dielectric layer indirectly placed above said dielectric layer A, provided with a second shield electrode on one principal plane;

a dielectric layer D whose at least one principal plane is exposed outside;

a dielectric layer B which is placed between said dielectric layer A and said dielectric layer C, and includes an inner circuit; and a first grounding electrode provided on the other principal plane of said dielectric layer A or said one principal plane of said dielectric layer D, wherein a via hole is provided in at least one of said dielectric layer A or said dielectric layer D, said first shield electrode and said second shield electrode are electrically connected, and said first grounding electrode and said first shield electrode are electrically connected through via holes provided on said dielectric layer A or said first grounding electrode and said second shield electrode are electrically connected through via holes provided on said dielectric layer D.

Another aspect of the present invention is the laminated electronic component, comprising an end face electrode provided on one side of said laminated electronic component to electrically connect said first shield electrode and said second shield electrode.

Still another aspect of the present invention is the laminated electronic component, wherein said dielectric layer B includes a resonator electrode as said inner circuit, said laminated electronic component is provided with a first terminal electrode connected to said resonator electrode, said end face electrode is a second grounding electrode to be connected to a predetermined grounding surface on a substrate on which said laminated electronic component is to be mounted, and said first terminal electrode is provided on sides of said dielectric layer A to dielectric layer D surrounded by said second grounding electrode or electrically connected to said second grounding electrode.

Yet still another aspect of the present invention is the laminated electronic component, wherein said dielectric layer B further includes a coupling electrode as said inner circuit, facing part of said resonator electrode, said laminated electronic component is provided with a second terminal electrode connected to said coupling electrode, and said second terminal electrode is (1) formed on said other principal plane of said dielectric layer A and/or said one principal plane of dielectric layer D in such a way that said second terminal electrode is not electrically connected to said first grounding electrode, and (2) electrically connected to said coupling electrode through a via hole different from said via hole.

Still yet another aspect of the present invention is the laminated electronic component, wherein said resonator electrode is constructed of a transmission line.

A further aspect of the present invention is the laminated electronic component, wherein said first grounding electrode is formed like either a mesh, band or spider's web.

A still further aspect of the present invention is the laminated electronic component, wherein said coupling electrode is constructed of a transmission line.

A yet further aspect of the present invention is the laminated electronic component, wherein said coupling electrode is an inter-stage coupling capacitor electrode constructed of a transmission line.

A still yet further aspect of the present invention is a laminated duplexer comprising:

a transmission filter using the laminated electronic component; and a reception filter using the laminated electronic component.

An additional aspect of the present invention is a communication device comprising:

a laminated filter using the laminated electronic component; and/or the laminated duplexer.

The above-described configuration forms via holes on the dielectric layer on the bottom surface or top surface, connects a shield electrode and grounding electrode via a via hole, thus making it possible to secure a large grounding area irrespective of whether there are external electrodes on the sides of the laminated electronic component or not and increase the grounding strength.

A still additional aspect of the present invention is the laminated electronic component, comprising an external terminal electrode which is connected to said inner circuit and has a first height from the bottom surface to the top surface of said laminated electronic component, wherein said end face electrode (1) is a second grounding electrode to connect to a predetermined grounding surface of a substrate on which said laminated electronic component is to be mounted and (2) has a second height from the bottom surface to the top surface of said laminated electronic component, and said first height is different from said second height.

A yet additional aspect of the present invention is the laminated electronic component, wherein said first height from the bottom surface of said laminated body of said external terminal electrode is smaller than said second height from the bottom surface of said laminated body of said second grounding electrode.

A still yet additional aspect of the present invention is the laminated electronic component, wherein said second grounding electrode is provided extending from the top surface to the bottom surface of said laminated body.

A supplementary aspect of the present invention is the laminated electronic component, comprising an external shield electrode connected to said second grounding electrode, wherein said external shield electrode is provided on the top surface of said laminated body.

A still supplementary aspect of the present invention is the laminated electronic component, comprising a lead-out side electrode connected to said shield electrode, wherein said lead-out side electrode is provided extending at least from the top surface of said laminated body to the area on the side of said laminated body where said external terminal electrode is formed, and the part provided on the side of said laminated body is placed higher than said external terminal electrode viewed from the bottom surface of said laminated body.

A yet supplementary aspect of the present invention is the laminated electronic component, wherein said lead-out side electrode is connected to said external shield electrode.

A still yet supplementary aspect of the present invention is the laminated electronic component, wherein said second grounding electrodes are placed on both sides of said external terminal electrode.

Another aspect of the present invention is the laminated electronic component; comprising a plurality of said external terminal electrodes, wherein said second grounding electrode is placed between said external terminal electrodes.

Still another aspect of the present invention is the laminated electronic component, wherein said lead-out side electrode is connected to at least one of said second grounding electrodes.

Yet still another aspect of the present invention is the laminated electronic component, wherein the distance between said external terminal electrode and said second grounding electrode placed next to said external terminal electrode is equal to or greater than the electrode width of said external terminal electrode.

Still yet another aspect of the present invention is the laminated electronic component, wherein said external terminal electrode and said second grounding electrode are buried in said laminated body or exposed outside said laminated body.

A further aspect of the present invention is the laminated electronic component, wherein said dielectric layer includes a crystal phase and glass phase, said crystal phase includes at least one of $Al_2O_3$, MgO, $SiO_2$ and $RO_a$ (R is at least one element selected from La, Ce, Pr, Nd, Sm and Gd, and a is a numerical value stoichiometrically determined according to the valence of said R).

A still further aspect of the present invention is the laminated electronic component wherein said dielectric layer includes $Bi_2O_3$, $Nb_2O_6$ as main components.

A yet further aspect of the present invention is a communication device, characterized by using the laminated electronic component.

The above-described laminated electronic component of the present invention is characterized in that the height of the external electrode connected to the input/output terminals of the at least one inner circuit is smaller than the height of the external grounding electrode connected to at least one shield electrode (inner grounding electrode).

A still yet further aspect of the present invention is a laminated electronic component comprising:

a laminated body that integrates a plurality of laminated dielectric sheets;

an inner circuit provided on the principal plane of a plurality of dielectric sheets within said laminated body;

a grounding electrode provided on the principal plane of a plurality of dielectric sheets within said laminated body;

a first via hole that penetrates the whole or part of said laminated body and electrically connects the grounding electrodes provided on the principal plane of said plurality of dielectric sheets;

a second via hole that penetrates the whole or part of said laminated body and electrically connects the inner circuits provided on the principal plane of said plurality of dielectric sheets; and an input terminal and output terminal electrically connected to said second via hole, wherein at least one of said grounding electrodes is provided as an exposed grounding electrode which is exposed outside from the principal plane of the dielectric sheet in bottom layer and/or top layer of said dielectric layer, and said input electrode and said output electrode are provided on both sides of said exposed grounding electrode on the same plane as the plane on which said exposed grounding electrode is provided.

An additional aspect of the present invention is the laminated electronic component, wherein said grounding electrodes other than said exposed grounding electrode have no exposed parts outside said laminated electronic component.

A still additional aspect of the present invention is the laminated electronic component, wherein said plurality of dielectric sheets has at least a first dielectric sheet and second dielectric sheet, said plurality of grounding electrodes has at least a first grounding electrode provided on the principal plane of said first dielectric sheet and a second grounding electrode provided on the principal plane of said second dielectric sheet, said second dielectric sheet is placed between said first grounding electrode and said second grounding electrode, and said first via hole at least penetrates said first dielectric sheet and/or said second dielectric sheet and electrically connects said first and second grounding electrodes.

A yet additional aspect of the present invention is the laminated electronic component, wherein said second dielectric sheet is provided in a layer superior to said first dielectric sheet.

A still yet additional aspect of the present invention is the laminated electronic component, wherein at least one dielectric sheet with said inner circuit provided on the principal plane is placed between said first dielectric sheet and said second dielectric sheet.

A supplementary aspect of the present invention is the laminated electronic component., wherein said first dielectric sheet and said second dielectric sheet are directly laminated together.

A still supplementary aspect of the present invention is the laminated electronic component, wherein said plurality of dielectric sheets includes at least a third dielectric sheet, said plurality of grounding electrodes includes at least a third grounding electrode provided on the principal plane of said third dielectric sheet, and said first via hole at least penetrates said third dielectric sheet and electrically connects said third dielectric sheet and said exposed grounding electrode.

A yet supplementary aspect of the present invention is the laminated electronic component, wherein at least one dielectric sheet with said inner circuit provided on the principal plane is placed between said third dielectric sheet and said dielectric sheet provided with said exposed grounding electrode.

A still yet supplementary aspect of the present invention is the laminated electronic component, wherein said third dielectric sheet and the dielectric sheet provided with said exposed grounding electrode constitute the same dielectric sheet.

Another aspect of the present invention is the laminated electronic component, wherein said dielectric sheet has a thickness of 5 to 50 $\mu$m.

Still another aspect of the present invention is the laminated electronic component, wherein said dielectric sheet is made of at least a crystal phase and a glass phase, said crystal phase contains at least one of $Al_2O_3$, MgO, $SiO_2$ and $RO_a$ (R is at least one element selected from La, Ce, Pr, Nd, Sm and Gd, and a is a numerical value stoichiometrically determined according to the valence of said R).

Yet still another aspect of the present invention is the laminated electronic component, wherein said dielectric sheet contains $Bi_2O_3$ and $Nb_2O_6$.

Still yet another aspect of the present invention is a high frequency radio device, mounting the laminated electronic component.

The above-described laminated electronic component of the present invention is, for example, an electronic part comprising a laminated body integrating a plurality of dielectric sheets placed one atop another and a plurality of inner circuits provided with an input electrode and an output electrode and a plurality of grounding electrodes inserted in the inner layer of the above-described laminated body, wherein a first grounding electrode is formed on the bottom surface of the above-described electronic part, a second grounding electrode is formed in the inner layer of the above-described electronic part and the above-described first grounding electrode and the above-described second grounding electrode are connected through at least two via holes.

DESCRIPTION OF SYMBOLS

101, 102, 103, 104, 105, 106, 107, 108 DIELECTRIC LAYERS
301, 302, 303, 304, 305, 306, 307, 308 DIELECTRIC LAYERS
401, 402, 403, 404, 405, 406, 407 DIELECTRIC LAYERS
109, 112, 118, 120 GROUNDING ELECTRODES
309, 315, 317 GROUNDING ELECTRODES
409, 417, 419 GROUNDING ELECTRODES
121, 122, 123, 124, 125, 126 VIA HOLES
420, 421, 422, 423 VIA HOLES
110, 111, 320, 321, 410, 411, 424 EXTERNAL ELECTRODES
113, 117, 119, 310, 314, 316 CAPACITOR ELECTRODES
412, 416, 418 CAPACITOR ELECTRODES
114, 115, 311, 312, 413, 414 STRIP LINES
C1, C2, C3 CAPACITANCES
L1, L2 INDUCTANCES
2101 DIELECTRIC LAYER
2102 SHIELD ELECTRODE
2103 RESONATOR ELECTRODE
2104, 2105 CAPACITOR ELECTRODES
2106, 2107 END FACE ELECTRODES
2108 GROUNDING ELECTRODE
2109 VIA HOLE ELECTRODE
3101 LAMINATED ELECTRONIC COMPONENT
3102 LAMINATED BODY
3103 EXTERNAL TERMINAL ELECTRODE

3104 EXTERNAL GROUNDING ELECTRODE
3201 LAMINATED ELECTRONIC COMPONENT
3202 LAMINATED BODY
3203 EXTERNAL TERMINAL ELECTRODE
3204 EXTERNAL GROUNDING ELECTRODE
3205 LEAD-OUT SIDE ELECTRODE
3206 EXTERNAL SHIELD ELECTRODE
3301 LAMINATED ELECTRONIC COMPONENT
3302 LAMINATED BODY
3303*a* EXTERNAL INPUT TERMINAL ELECTRODE
3303*b* EXTERNAL OUTPUT TERMINAL ELECTRODE
3304 EXTERNAL GROUNDING ELECTRODE
3305*a* LEAD-OUT SIDE ELECTRODE
3305*b* LEAD-OUT SIDE ELECTRODE
3401 FIRST DIELECTRIC LAYER
3402 SECOND DIELECTRIC LAYER
3403 THIRD DIELECTRIC LAYER
3404 FOURTH DIELECTRIC LAYER
3405 FIFTH DIELECTRIC LAYER
3406 SIXTH DIELECTRIC LAYER
3407 SEVENTH DIELECTRIC LAYER
3408 EIGHTH DIELECTRIC LAYER
3409 INNER GROUNDING ELECTRODE
3410 CAPACITOR ELECTRODE
3411 STRIP LINE
3411 STRIP LINE
3413 CONNECTION POINT
3414 CAPACITOR ELECTRODE
3415 INNER GROUNDING ELECTRODE
3416 CAPACITOR ELECTRODE
3417 INNER GROUNDING ELECTRODE
3418 CONNECTION POINT
3419 CONNECTION POINT
3501 FIRST EXTERNAL ELECTRODE CONNECTED TO INPUT/OUTPUT TERMINAL OF INNER CIRCUIT
3502 SECOND EXTERNAL ELECTRODE CONNECTED TO INPUT/OUTPUT TERMINAL OF INNER CIRCUIT
3503 EXTERNAL ELECTRODE CONNECTED TO SHIELD ELECTRODE
3601*a* CONNECTION ELECTRODE
3601*b* CONNECTION ELECTRODE
3602 EXTERNAL SHIELD ELECTRODE
3701 LAMINATED ELECTRONIC COMPONENT
3702 LAMINATED BODY
3703*a* EXTERNAL INPUT TERMINAL ELECTRODE
3703*b* EXTERNAL OUTPUT TERMINAL ELECTRODE
3704 EXTERNAL GROUNDING ELECTRODE
3705*a* LEAD-OUT SIDE ELECTRODE
3705*b* LEAD-OUT SIDE ELECTRODE
3706 CONNECTION ELECTRODE
3707 EXTERNAL SHIELD ELECTRODE
3801 LAMINATED ELECTRONIC COMPONENT
3802 LAMINATED BODY
3803*a* EXTERNAL ELECTRODE
3803*b* EXTERNAL ELECTRODE
3083*c* EXTERNAL ELECTRODE
3901 LAMINATED TYPE ELECTRONIC PART
3902 LAMINATED BODY
3903 EXTERNAL ELECTRODE
3904 EXTERNAL ELECTRODE

MODE FOR CARRYING OUT THE INVENTION

With reference now to the attached drawings, embodiments of the present invention will be explained below.

(Embodiment 1)

A laminated electronic component according to Embodiment 1 of the present invention will be explained with reference to the attached drawings.

Figure 1:
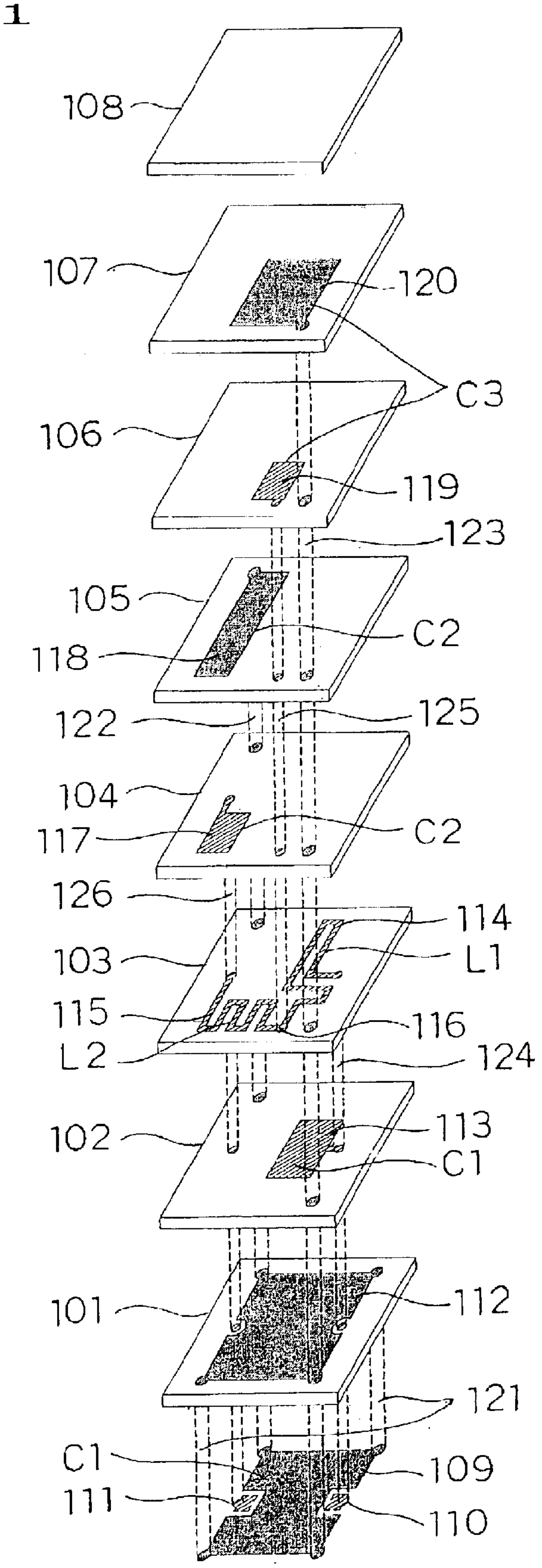
FIG. 1 is an exploded perspective view of a laminated electronic component according to Embodiment 1 of the present invention.

FIG. 1 is an exploded perspective view of the laminated electronic component according to Embodiment 1 the present invention. As shown in FIG. 1, the laminated electronic component of the present invention comprises a dielectric layer 101 to dielectric layer 108 placed one atop another and each dielectric layer is a dielectric sheet made of a crystal phase and glass phase having a specific inductive capacity $\in_r=7$ and dielectric loss tan $\delta=2.0\times10^{-4}$.

A grounding electrode 109, an input electrode 110 and output electrode 111 of the circuit are placed on the bottom surface of the dielectric layer 101 and a grounding electrode 112 is placed on the top surface of the dielectric layer 101.

Furthermore, a capacitor electrode 113 is placed on the dielectric layer 102, a strip line 114 and strip line 115 are placed on the dielectric layer 103 and connected at a connection point 116.

A capacitor electrode 117, a grounding electrode 118, a capacitor electrode 119 and a grounding electrode 120 are placed on the dielectric layers 104, 105, 106 and 107 respectively.

Furthermore, the grounding electrode 112 is connected to the grounding electrode 109 through via holes 121, 122 and 123 and the grounding electrodes 118 and 120 are connected to the grounding electrode 112 through via holes 122 and 123 respectively.

Furthermore, one end of the strip line 114 and the capacitor electrode 113 are connected to the input electrode 110 through a via hole 124.

The capacitor electrode 119 is connected to the connection point 116 through a via hole 125 and the capacitor electrode 117 and one end of the strip line 115 are connected to the output electrode 111 through a via hole 126.

However, for simplicity of the above-described explanations, the positions of the via holes in the drawing are schematically shown with dotted line in the exploded perspective view in principle. The same will apply to the following embodiments.

An operation of the laminated electronic component according to Embodiment 1 configured as shown above will be explained using FIG. 1 and FIG. 2 below.

Figure 2:
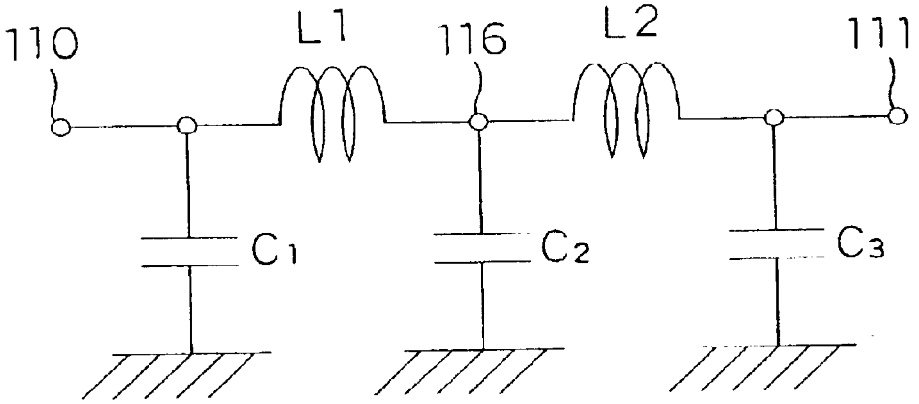
FIG. 2 is an equivalent circuit diagram of the laminated electronic component according to Embodiment 1 of the present invention.
Figure 3:
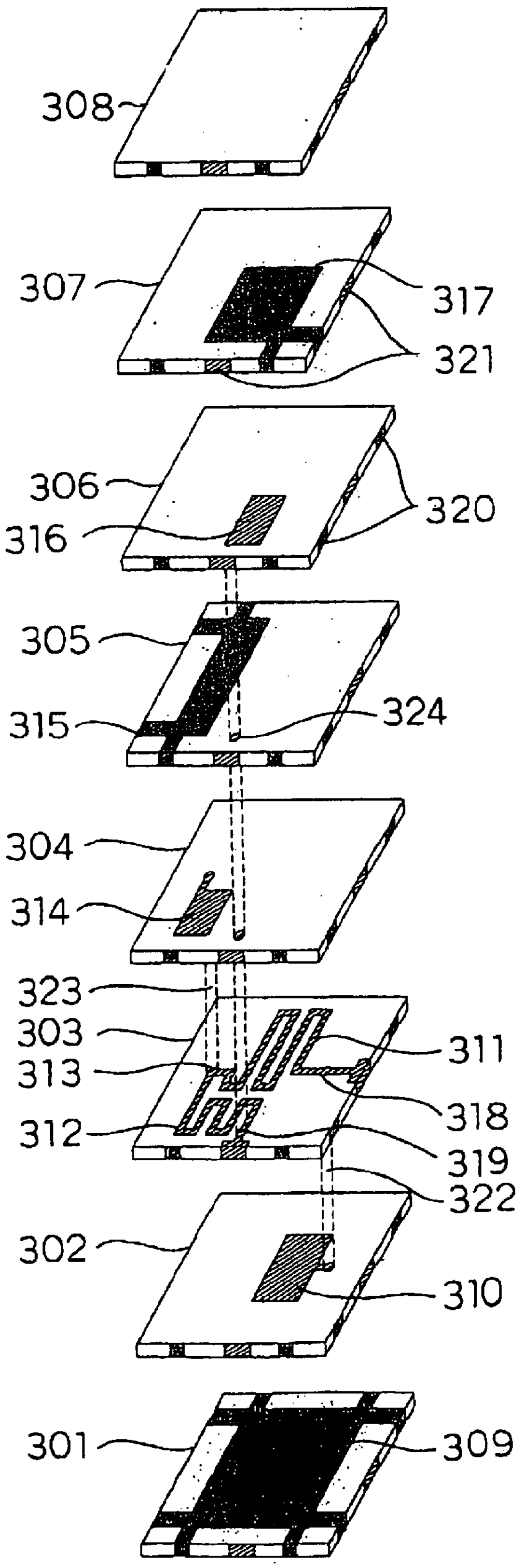
Fig. 3 PRIOR ART
FIG. 3 is an exploded perspective view of a conventional laminated electronic component.

First, FIG. 2 shows an equivalent circuit diagram of the laminated electronic component in FIG. 1 and the elements that correspond to those in FIG. 1 are indicated with the same element numbers.

In FIG. 2, capacitance C1 is formed between the capacitor electrode 113 and grounding electrode 110 and capacitance C2 is formed between the capacitor electrode 117 and grounding electrode 118.

Furthermore, capacitance C3 is formed between the capacitor electrode 119 and grounding electrode 120 and inductances L1 and L2 are formed of the strip lines 114 and 115 respectively.

Furthermore, L1 is connected in series with the input electrode 110 and C1 is connected in parallel with the input electrode 110 and L2 is connected in series with the output electrode 111 and C3 is connected in parallel with the output electrode 111, and L1 and L2 are connected in series and C2 is connected in parallel at the connection point 116.

Thus, the laminated electronic component in FIG. 1 constitutes a 5-stage low pass filter.

Here, the grounding electrodes 118 and 120 forming the capacitance C2 and C3 respectively are connected to the grounding electrode 110 forming the capacitance C1 through via holes 122 and 123, and the grounding electrode 112 is further connected to the grounding electrode 109 through via holes 121, 122 and 123.

That is, the grounding electrodes 109, 112, 118 and 120 placed in the inner layers of the laminated electronic component are all connected inside the laminated electronic component through via holes 121, 122 and 123 and the grounding electrode 109 formed on the bottom surface of the laminated electronic component is further used as an external electrode of the grounding electrodes.

Furthermore, the input electrode 110 and output electrode 111 of the low pass filter are placed in such a way that part of the grounding electrode 109 is sandwiched between the two electrodes.

As described above, the laminated electronic component according to Embodiment 1 of the present invention allows the grounding electrode 109 with a wider area than the conventional configuration to be formed on the bottom surface of the laminated electronic component.

Therefore, compared to the conventional configuration that provides the grounding electrode and an input electrode and output electrode of the circuit on the sides of the laminated electronic component, a wider grounding area on the mounting substrate is provided, which increases electrical grounding strength.

This makes it possible to prevent deterioration of high frequency characteristics and stabilize characteristics of the inner circuit of the laminated electronic component.

Especially, when used as a laminated filter, etc. handling an input signal of 1 GHz or greater, the laminated electronic component of this embodiment has the effect of preventing deterioration of the high frequency characteristic of a filter circuit, etc., that is, the frequency selection characteristic in a high frequency area.

Furthermore, the configuration with the grounding electrode 109 formed between the input electrode 110 and output electrode 111 prevents coupling between the input electrode and output electrode, thus enhancing the isolation characteristic.

Furthermore, the configuration that the external electrodes 109, 110 and 111 are only formed on the bottom surface of the laminated electronic component and that no external electrode exists on the sides of the laminated electronic component eliminates the need to form any external electrode on the sides of the laminated electronic component, and therefore the accuracy of flatness of the section of the laminated body, that is, the sides of the laminated electronic component is not required when laminated electronic components are cut from the laminated matrix.

Furthermore, the presence of the external electrode only on the bottom surface of the laminated electronic component makes it possible to form terminals according to a BGA (Ball Grid Array) or LGA (Land Grid Array) system, thus allowing high-density mounting. Furthermore, the process of forming external electrodes can be performed simultaneously with the process of printing inner electrodes, which contributes to simplification of the manufacturing process, leading to a cost reduction.

By the way, the grounding electrode, input electrode and output electrode, which constitute external electrodes, can also be provided on the top surface instead of the bottom surface of the laminated electronic component or providing them on both the bottom surface and top surfaces will produce similar effects.

Embodiment 1 of the present invention has described an example of a dielectric sheet made of a crystal phase and glass phase having a specific inductive capacity $\epsilon_r=7$ and dielectric loss tan $\delta=2.0\times10^{-4}$ as the dielectric layer 101 to dielectric layer 108, but using a dielectric sheet made of a crystal phase and glass phase having a specific inductive capacity $\epsilon_r=5$ to 10 will also produce similar effects.

The same applies to the case where a dielectric sheet whose main components are $Bi_2O_3$, $Nb_2O_5$ with a specific inductive capacity $\epsilon_r=50$ to 100 is used, producing similar effects irrespective of the composition of the dielectric sheet, specific inductive capacity and dielectric loss of the dielectric sheet.

Furthermore, Embodiment 1 of the present invention has described an example of a lowpass filter configuration, but this configuration will produce similar effects on various filters such as a highpass filter and bandpass filter.

(Embodiment 2)

A laminated electronic component according to Embodiment 2 of the present invention will be explained with reference to the attached drawings.

Figure 4:
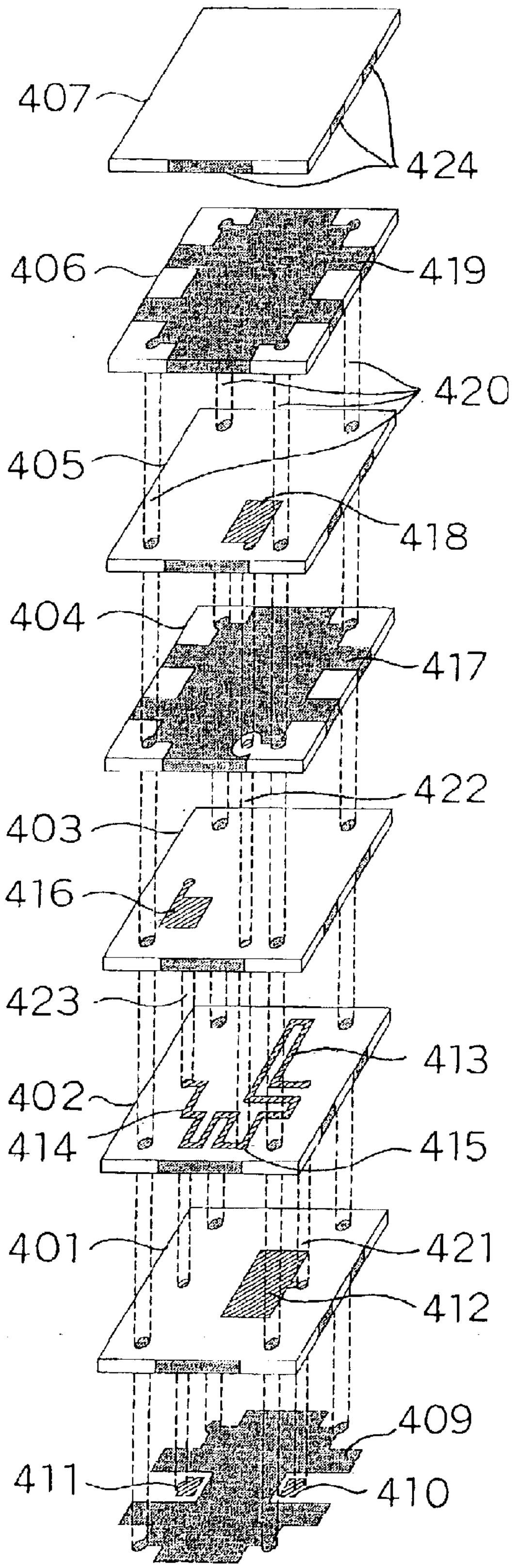
FIG. 4 is an exploded perspective view of a laminated electronic component according to Embodiment 2 of the present invention.

FIG. 4 is an exploded perspective view of a laminated electronic component according to Embodiment 2 of the present invention.

As shown in FIG. 4, the laminated electronic component of the present invention consists of dielectric layer 401 to dielectric layer 407 placed one atop another and each dielectric layer is a dielectric sheet made of a crystal phase and glass phase having a specific inductive capacity $\epsilon_r=7$ and dielectric loss tan $\delta=2.0\times10^{-4}$.

A grounding electrode 409, an input electrode 410 and output electrode 411 of the circuit are placed on the bottom surface of the dielectric layer 401 and a capacitor electrode 412 is placed on the top surface of the dielectric layer 401.

Furthermore, a strip line 413 and strip line 414 are placed on the dielectric layer 402 and connected at a connection point 415.

The dielectric layers 403, 404, 405 and 406 are provided with a capacitor electrode 416, grounding electrode 417, capacitor electrode 418 and grounding electrode 419 respectively.

Furthermore, grounding electrodes 417 and 419 are connected to the grounding electrode 409 through via holes 420.

Furthermore, one end of the strip line 413 and the capacitor electrode 412 are connected to the input electrode 410 through a via hole 421.

The capacitor electrode 418 is connected to the connection point 415 through a via hole 422, and the capacitor electrode 416 and one end of the strip line 414 are connected to the output electrode 411 through a via hole 423.

Furthermore, the grounding electrodes 409, 417 and 419 are connected to an external electrode 427 formed on the side of the laminated electronic component.

As shown above, unlike Embodiment 1 of the present invention, the laminated electronic component according to Embodiment 2 of the present invention includes a plurality of capacitor electrodes and strip lines between the grounding electrode 409 placed on the bottom surface of the laminated electronic component and the grounding electrodes 417 and 419 placed in the inner layers of the laminated electronic component. However, in this case, it is also possible to form the grounding electrode 409 with a wider area than the conventional configuration on the bottom surface of the laminated electronic component as in the case of Embodiment 1 of the present invention.

Therefore, compared to a conventional configuration that a grounding electrode and an input electrode and output electrode are provided on the sides of the laminated electronic component, this embodiment has a wider grounding area on the mounting substrate, and thereby increases the electrical grounding strength.

On the other hand, although this embodiment includes differences in that not only all grounding electrodes are connected in the inner layers of the laminated electronic component through the via holes 420 but also they are connected on the sides of the laminated electronic component through the external electrode 424, this structure further increases the electrical grounding strength compared to Embodiment 1 of the present invention.

Therefore, this prevents deterioration of high frequency characteristics and makes it possible to stabilize characteristics of the inner circuit of the laminated electronic component.

Especially, when used as a laminated filter, etc. handling an input signal of 1 GHz or higher, the laminated electronic component of this embodiment has the effect of further suppressing deterioration of high frequency characteristics of a filter circuit, etc., that is, frequency selecting characteristics in a high frequency area.

Figure 5A:
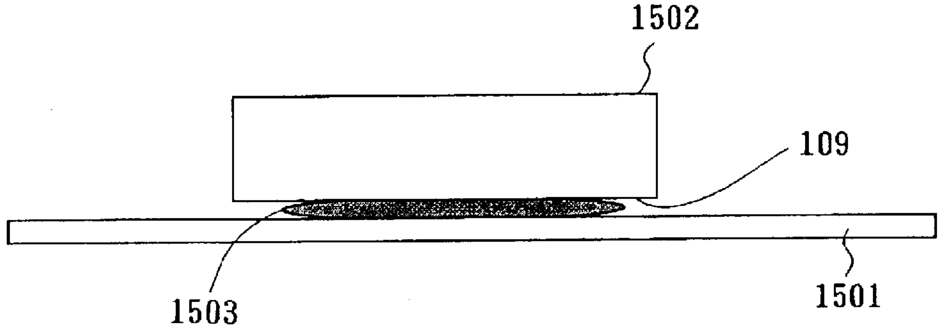
FIG. 5A is a schematic view showing how the laminated electronic component according to Embodiment 1 is connected with a motherboard.
Figure 5B:
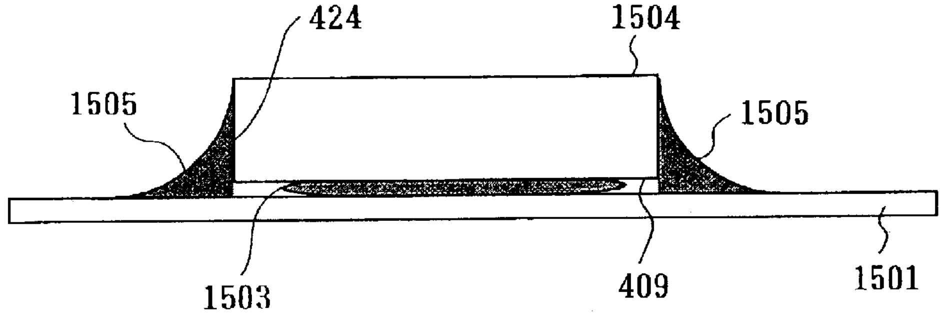
FIG. 5B is a schematic view showing how the laminated electronic component according to Embodiment 2 is connected with the motherboard.

Here, when the respective laminated electronic components explained in the above-described two embodiments using FIG. 5A and FIG. 5B are mounted on a motherboard, a brief explanation will be given below as to how those laminated electronic components are connected to their respective motherboards.

FIG. 5A and FIG. 5B are side views schematically showing how the laminated electronic components 1502 and 1504 are connected to the grounding surface of the motherboard 1501 by means of soldering, etc. Here, the thickness of solder, etc. is illustrated with some exaggeration for illustrative effects.

As shown in FIG. 5A, the laminated electronic component 1502 described in Embodiment 1 is electrically connected to the grounding surface of the motherboard 1501 through the grounding electrode 109 by means of the solder 1503, etc. On the other hand, as shown in FIG. 5B, the laminated electronic component 1504 described in Embodiment 2 is electrically connected to the grounding surface of the motherboard 1501 through the grounding electrode 409 by means of the solder 1505, etc.

Furthermore, as in the case of Embodiment 1 of the present invention, the configuration that the grounding electrode 409 is formed between the input electrode 410 and output electrode 411 can prevent any connection between the input electrode and output electrode, strengthening isolation.

Furthermore, Embodiment 2 of the present invention has described an example of a dielectric sheet made of a crystal phase and glass phase having a specific inductive capacity $\in_r=7$ and dielectric loss tan $\delta=2.0\times10^{-4}$ as the dielectric layer 101 to dielectric layer 108, but using a dielectric sheet made of a crystal phase and glass phase having a specific inductive capacity $\in_r=5$ to 10 will also produce similar effects.

The same applies to the case where a dielectric sheet whose main components are $Bi_2O_3$, $Nb_2O_5$ with a specific inductive capacity $\in_r=50$ to 100 is used, producing similar effects irrespective of the composition of the dielectric sheet, specific inductive capacity and dielectric loss of the dielectric sheet.

Furthermore, Embodiment 2 of the present invention has described an example of a low pass filter configuration, but this configuration will also produce similar effects on various filters such as a highpass filter and bandpass filter as in the case of Embodiment 1.

Furthermore, when the laminated electronic component according to the respective embodiments of the present invention is used as a filter for a high frequency radio device, using bottom surface mounting such as BGA allows high-density mounting on a substrate, which makes it possible to miniaturize a high frequency radio device. Moreover, a wide installation area on the mounting board increases folding resistance, leading to improved reliability in drop tests, etc.

Figure 6:
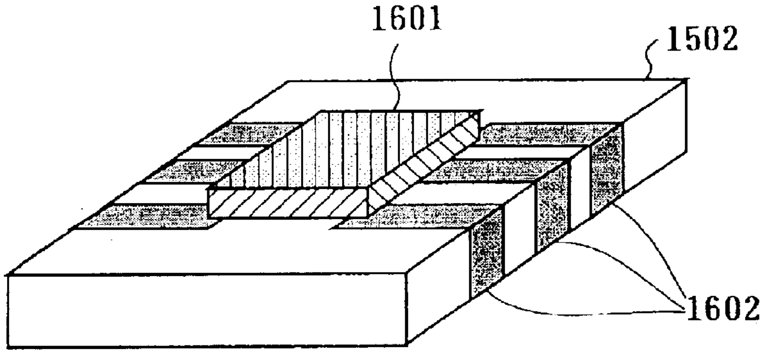
FIG. 6 is a perspective view showing a chip part mounted on the surface of the laminated electronic component according to Embodiment 1.
Figure 7:
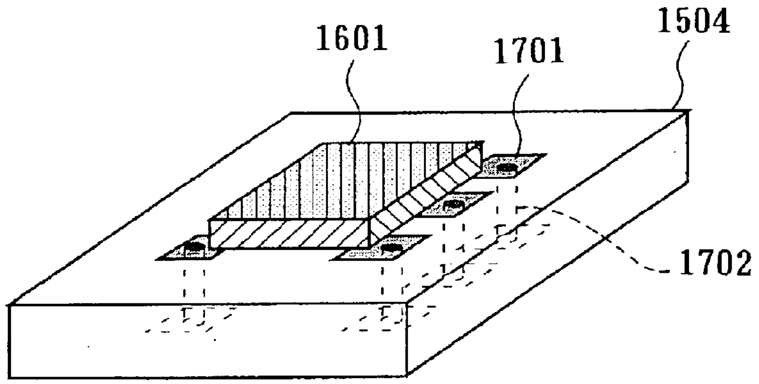
FIG. 7 is a perspective view showing a chip part mounted on the surface of the laminated electronic component according to Embodiment 2.

Furthermore, as shown in FIG. 6 and FIG. 7, it is also possible to mount a chip part such as a switch on the surface of the laminated electronic component according to the above-described embodiment.

That is, FIG. 6 is a perspective view showing that a chip part 1601 is mounted on the surface of the laminated electronic component 1502 of Embodiment 1. External electrodes 1602 provided on the surface and sides of the laminated electronic component 1502 are the electrodes to electrically connect the chip part 1601 to a predetermined electrode pattern on the motherboard (not shown).

Since the laminated electronic component 1502 of Embodiment 1 has no electrode of the laminated electronic component itself on its sides, this has the effect of allowing electrodes necessary for connection of the chip part 1601 to be freely placed.

On the other hand, FIG. 7 is a perspective view showing that a chip part 1601 is mounted on the surface of the laminated electronic component 1504 of Embodiment 2. External electrodes 1701 provided on the surface of the laminated electronic component 1504 are the electrodes to electrically connect to an external terminal (not shown) provided on the back of the chip part 1601.

Furthermore, via holes 1702 that penetrate inside the laminated electronic component 1504 are the electrodes to electrically connect a predetermined electrode pattern on the motherboard (not shown) and the external electrode 1701.

Even when the own electrode exists on its side as in the case of the laminated electronic component 1504 of Embodiment 2, using via holes has the effect of allowing connection of the chip part 1601 to the motherboard.

Furthermore, it is also possible to adopt a configuration combining FIG. 6 and FIG. 7. In this case, one terminal of the chip part 1601 is connected to a predetermined electrode pattern on the motherboard through the external electrode 1602 as shown in FIG. 6 and the other terminal of the chip part 1601 is connected to another electrode pattern on the motherboard through the via holes 1702 shown in FIG. 7.

Furthermore, it is of course possible to adopt a configuration that the other terminal of the chip part 1601 is electrically connected to the inner circuit of the above-described laminated electronic component through the above-described external electrode and the above-described via holes, etc.

The grounding electrode of the present invention corresponds to the grounding electrode 109 (FIG. 1) and the grounding electrode 409 (FIG. 4) in the above-described embodiments.

Furthermore, the first shield electrode of the present invention corresponds to the grounding electrode 112 (FIG. 1) and grounding electrode 417 (FIG. 4), while the second shield electrode of the present invention corresponds to the grounding electrodes 120 and 118 (FIG. 1) and grounding electrode 419 (FIG. 4). Furthermore, the end face electrode of the present invention corresponds to the external electrode 424 (FIG. 4).

In the case of the laminated electronic component shown in FIG. 1, etc., the electrode 109, etc. that corresponds to the grounding electrode of the present invention may be called "exposed grounding electrode" and the electrodes 112, 118 and 120, etc. that correspond to the first or second shield electrode of the present invention may be called "inner grounding electrodes".

It may be difficult to clearly distinguish between the shield function and grounding function of these electrodes.

As shown above, the present invention makes it possible to form grounding electrodes with wider areas on the bottom surface or top surface of the laminated electronic component than the conventional ones and a wider grounding area on the mounting substrate increases electrical grounding strength.

This makes it possible to provide a laminated electronic component capable of preventing deterioration of high frequency characteristics and stabilizing characteristics of the inner circuit of the laminated electronic component.

Furthermore, forming an input electrode and output electrode of the circuit between which the grounding electrode formed on the bottom surface or top surface of the laminated electronic component is sandwiched makes it possible to prevent connection between the input electrode and output electrode and provide a laminated electronic component with an enhanced isolation characteristic.

(Embodiment B1)

Figure 8:
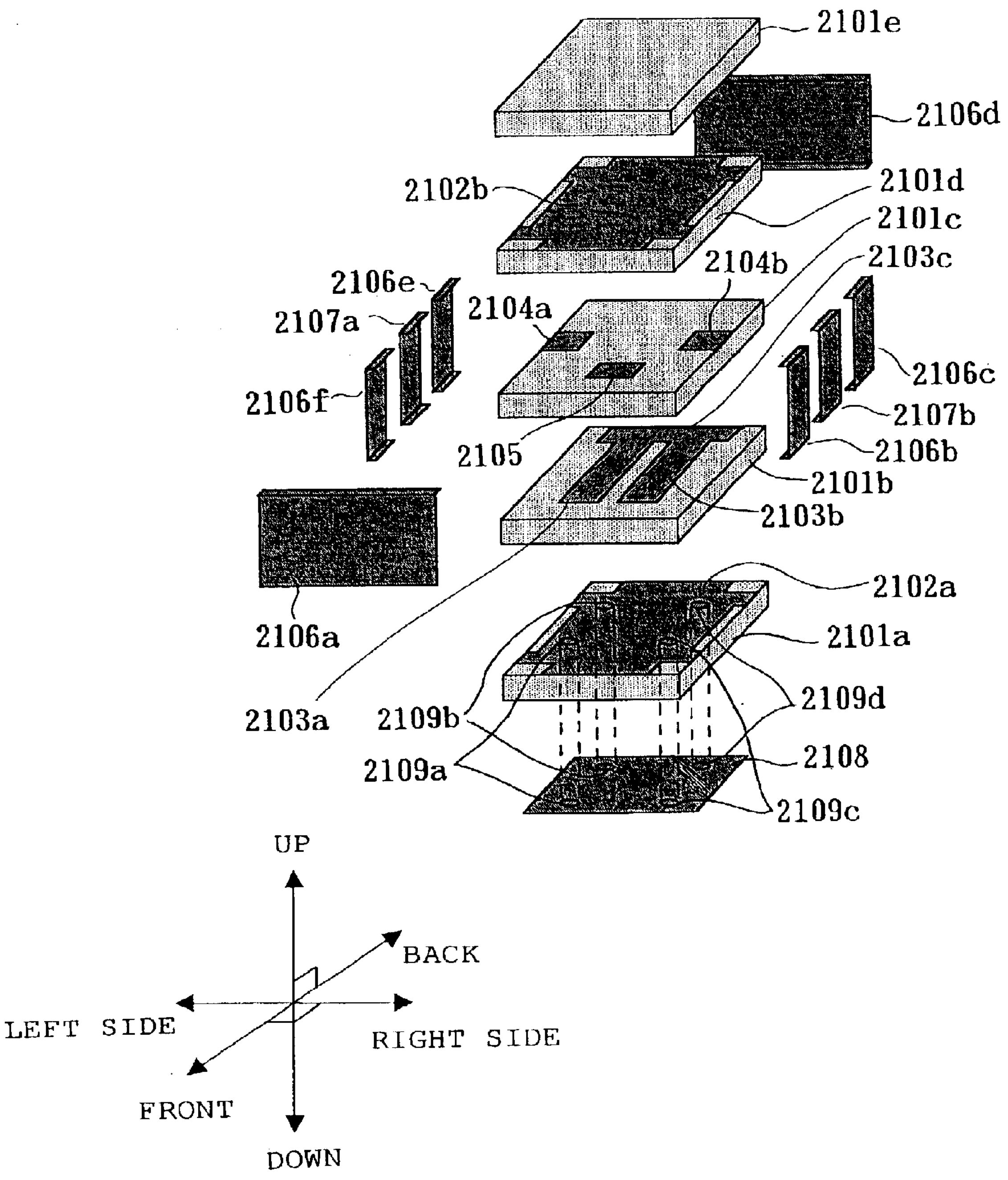
FIG. 8 is an exploded perspective view of a laminated filter according to Embodiment B1 of the present invention.

FIG. 8 shows an exploded perspective view of a laminated filter according to Embodiment B1 of the present invention.

In FIG. 8, reference numeral 2101 denotes a dielectric layer; 2102, a shield electrode; 2103, a resonator electrode; 2104 and 2105, capacitor electrodes; 2106 and 2107, end face electrodes; 2108, a grounding electrode; 2109, via hole electrodes.

Then, the laminated structure of this laminated filter will be explained. However, suppose the upward and downward directions, and backward and forward directions in the figure are determined based on the arrows shown in the figure.

The laminated filter of this embodiment comprises a first shield electrode 2102*a* on the upper principal plane of a first dielectric layer 2101*a* and the grounding electrode 2108 on the lower principal plane of the first shield electrode 2102*a*.

Furthermore, a second dielectric layer 2101*b* is placed on the upper principal plane of the first shield electrode 2102*a* and two resonator electrodes 2103*a* and 2103*b* are placed on the upper principal plane of the dielectric layer 2101*b*.

Furthermore, a third dielectric layer 2101*c* is placed on the upper principal plane of the dielectric layer 2101*b* and three capacitor electrodes 2104*a*, 2104*b* and 2105 are placed on the upper principal plane of the dielectric layer 2101*c*.

Furthermore, a fourth dielectric layer 2101*d* is placed on the capacitor electrodes 2104*a*, 2104*b* and 2105, a second shield electrode 2102*b* is placed on the upper principal plane of the laminated layer 2101*d* and a fifth dielectric layer 2101*e* is placed on the second shield electrode 2102*b*. Here, the laminated first to fifth dielectric layers are collectively called "dielectrics".

Furthermore, via holes that penetrate the upper and lower principal planes are made in the first dielectric layer 2101*a* and via hole electrodes 2109*a*, 2109*b*, 2109*c* and 2109*d* are placed at their respective via holes in such a way that the via hole electrode first shield electrode 2102*a* and the grounding electrode 2108 are electrically connected.

The laminated structure of the dielectric filter of this embodiment is formed in this way.

Furthermore, electrodes are also provided on the sides of the dielectrics and will be explained below. An end face electrode 2106*a* is provided on the front of the dielectric, an end face electrode 2106*d* is provided on the back of the dielectric, end face electrodes 2106*b* and 2106*c* are provided on the right side of the dielectric and end face electrodes 2106*e* and 2106*f* are provided on the left side of the dielectric.

On the left side of the dielectric, an end face electrode 2107*a* is further placed between the end face electrodes 2106*f* and 2106*e* and on the right side of the dielectric, an end face electrode 2107*b* is further placed between the end face electrodes 2106*b* and 2106*c*.

Next, a connection relationship between these end face electrodes and the electrodes formed on the respective dielectric layers will be explained.

The first shield electrode 2102*a*, a shorted edge 2103*c* on the back of the dielectric layer 2101*b* and the second shield electrode 2102*b* are connected by the end face electrode 2106*d*. Here, both the resonator electrodes 2103*a* and 2103*b* are connected by the shorted edge 2103*c*.

As described in FIG. 5B, the end face electrode 2106*d* is electrically connected using solder, etc. to the grounding pattern electrode on a motherboard (not shown) on which the laminated filter of this embodiment in FIG. 8 is to be mounted.

Furthermore, the capacitor electrode 2104*a* and the end face electrode 2107*a* are connected and the capacitor electrode 2104*b* and the end face electrode 2107*b* are connected. Furthermore, the first shield electrode 2102*a* and the second shield electrode 2102*b* are connected by the end face electrode 2106*a*.

As in the case of the above-described end face electrode 2106*d*, the end face electrode 2106*a* is electrically connected to the grounding pattern electrode of the motherboard.

Furthermore, the first shield electrode 2102*a* and the second shield electrode 2102*b* are connected by the end face electrodes 2106*b*, 2106*c*, 2106*e* and 2106*f*. Here, the end face electrode 2106*a* is connected to the 2106*b* and 2106*f*, while the end face electrode 2106*d* is connected to the 2106*c* and 2106*e*.

Furthermore, the grounding electrode 2108 is connected to the first shield electrode 2102*a* through the via hole electrodes 2109*a*, 2109*b*, 2109*c* and 2109*d*.

Figure 9:
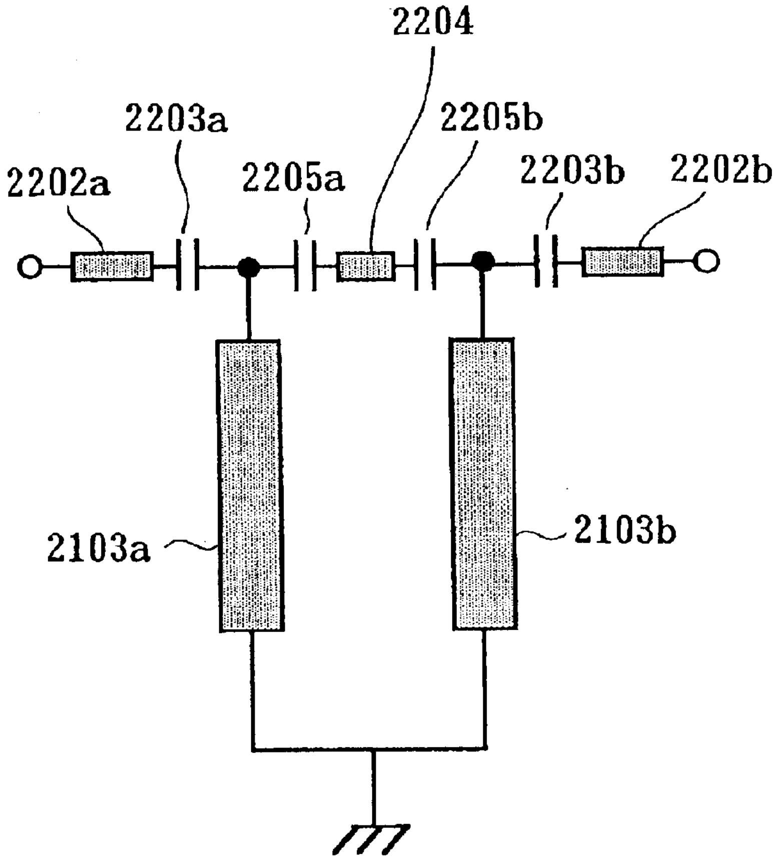
FIG. 9 is an equivalent circuit diagram of the laminated filter according to Embodiment B1 of the present invention.

Here, FIG. 9 shows an equivalent circuit of the laminated filter according to Embodiment B1 of the present invention. An operation of the laminated filter according to Embodiment B1 of the present invention will be explained with reference to the equivalent circuits in FIG. 8 and FIG. 9.

Since the resonator electrodes 2103*a* and 2103*b* are grounded through the end face electrode 2106*d*, they act as a one quarter-wavelength resonator. The capacitor electrode 2105 is placed facing part of the resonator electrode 2103*a* and part of the resonator electrode 2103*b*, forming capacitors 2205*a* and 2205*b* that act as inter-stage coupling capacitors.

Furthermore, these capacitors 2205*a* and 2205*b* are connected through a transmission line 2204 that corresponds to the part not facing the resonator electrodes 2103*a* and 2103*b* in the capacitor electrode 2105.

The capacitor electrode 2104*a* is placed facing part of the resonator electrode 2103*a* and the capacitor electrode 2104*b* is placed facing part of the resonator electrode 2103*b*, forming input/output coupling capacitors 2203*a* and 2203*b*.

Furthermore, these capacitors 2203*a* and 2203*b* are connected to the transmission lines 2202*a* and 2202*b* that correspond to the end face electrodes 2107*a* and 2107*b*.

Thus, the dielectric filter according to Embodiment B1 operates as a bandpass filter.

As shown above, this embodiment forms via holes in the dielectric layer at the bottom of the dielectric, connects the shield electrode and the grounding electrode through the via holes, can thereby provide grounding with the entire bottom surface of the dielectric and realize a bandpass filter with a sharp attenuation characteristic.

Furthermore, providing grounding with the grounding electrode of the entire bottom surface increases folding resistance and also increases resistance in drop tests compared to the conventional structure.

The grounding electrode 2108 has been described as a flat plate in the above explanations, but using a mesh-, band- or spider's web-like grounding electrode can reduce warpage due to the electrodes leaning to the underside while keeping the same attenuation characteristic.

Furthermore, the grounding electrode has been described to be provided on the bottom surface of the dielectric, but it can also be placed on the top surface and connected to the shield electrode through via holes in the same way as in the case of the bottom surface.

This embodiment has described a two-stage bandpass filter, but similar effects will also be obtained with a band-pass filter having three or more stages and in this case it is possible to use five or more dielectric layers.

The dielectric layers A, C and D of the present invention correspond to the dielectric layers 2101*a*, 2101*d* and 2101*e* of the above embodiment respectively. The dielectric layer B of the present invention corresponds to the dielectric layer 2101*b* and/or 2101*c*. The inner circuit of the present invention includes resonator electrodes 103 (103*a* to 103*c*), etc.

Furthermore, the first grounding electrode of the present invention corresponds to the grounding electrode 2108 and the second grounding electrode of the present invention corresponds to grounding electrodes 2106*a* to 2106*f*. Furthermore, the first terminal electrode of the present invention corresponds to end face electrode 2106*d* and the second terminal electrode of the present invention corresponds to end face electrodes 2107*a* and 2107*b*.

(Embodiment B2)

The laminated filter according to Embodiment B2 of the present invention will be explained with reference to the attached drawings below.

Figure 10:
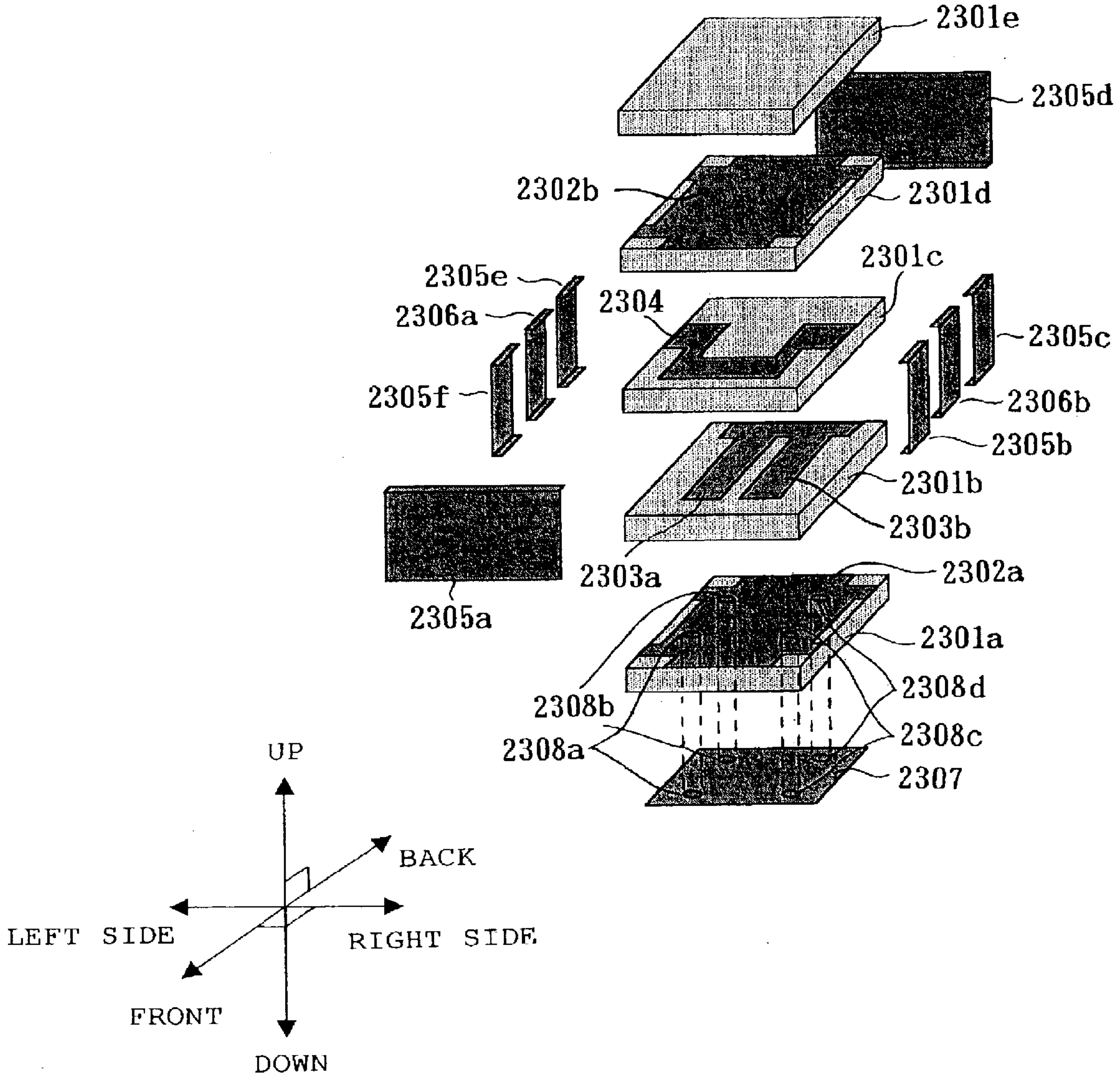
FIG. 10 is an exploded perspective view of a laminated filter according to Embodiment B2 of the present invention.

FIG. 10 is an exploded perspective view of the laminated filter according to this embodiment of the present invention.

In FIG. 10, reference numeral 2301 denotes a dielectric layer; 2302, a shield electrode; 2303, resonator electrodes; 2304, a transmission line electrode; 2305 and 2306, end face electrodes; 2307, a grounding electrode; 2308, via hole electrodes.

Then, the laminated structure of this laminated filter will be explained. However, suppose the upward and downward directions, and backward and forward directions in the figure are determined in the same way as shown in FIG. 8.

The laminated filter of this embodiment comprises a first shield electrode 2302*a* on the upper principal plane of a first dielectric layer 2301*a* and the grounding electrode 2307 on the lower principal plane of the first dielectric layer 2301*a*.

Furthermore, a second dielectric layer 2301*b* is placed on the upper principal plane of the first shield electrode 2302*a* and two resonator electrodes 2303*a* and 2303*b* are placed on the upper principal plane of the dielectric layer 2301*b*.

Furthermore, a third dielectric layer 2301*c* is placed on the upper principal plane of the dielectric layer 2301*b* and a transmission line electrodes 2304*a* is placed on the upper principal plane of the dielectric layer 2301*c*. Furthermore, a fourth dielectric layer 2301*d* is placed on the transmission line electrode 2104*a* and a second shield electrode 2302*b* is placed on the upper principal plane of the laminated layer 2301*d*.

Then, a fifth dielectric layer 2301*e* is placed on the second shield electrode 2302*b*. Here, the first to fifth laminated dielectric layers are collectively called "dielectrics".

Furthermore, via holes that penetrate the upper and lower principal planes are made in the first dielectric layer 2301*a* and via hole electrodes 2308*a*, 2308*b*, 2308*c* and 2308*d* are placed at their respective via holes in such a way that the first shield electrode 2302*a* and the grounding electrode 2308 are electrically connected.

The laminated structure of the dielectric filter of the this embodiment is formed in this way.

Furthermore, electrodes are also provided on each side of the dielectrics and will be explained below.

An end face electrode 2305*a* is provided on the front of the dielectric and an end face electrode 2305*d* is provided on the back of the dielectric. End face electrodes 2305*b* and 2305*c* are provided on the right side of the dielectric and end face electrodes 2305*e* and 2305*f* are provided on the left side of the dielectric.

On the left side of the dielectric, an end face electrode 2306*a* is further placed between the end face electrodes 2305*f* and 2305*e* and on the right side of the dielectric, an end face electrode 2306*b* is further placed between the end face electrodes 2305*b* and 2305*c*.

Next, a connection relationship between these end face electrodes and the electrodes formed on the respective dielectric layers will be explained.

The first shield electrode 2302*a*, a shorted edge on the back of the dielectric layer 2301*b* to which both the resonator electrodes 2303*a* and 2303*b* are connected and the second shield electrode 2302*b* are connected and grounded by the end face electrode 2305*d*.

Furthermore, one end of the transmission line electrode 2304 and the end face electrode 2306*a* are connected and the other end of the transmission line electrode 2304 and the end face electrode 2306*b* are connected. The first shield electrode 2302*a* and the second shield electrode 2302*b* are connected and grounded by the end face electrode 2305*a*.

Furthermore, the first shield electrode 2302*a* and the second shield electrode 2302*b* are connected by the end face electrodes 2305*b*, 2305*c*, 2305*e* and 2305*f*.

Here, the end face electrode 2305*a* is connected to 2305*b* and 2305*f*, and 2305*d* is connected to 2305*c* and 2305*e*.

Furthermore, the grounding electrode 2307 is connected to the first shield electrode 2302*a* through the via hole electrodes 2307*a*, 2307*b*, 2307*c* and 2307*d*.

Figure 11:
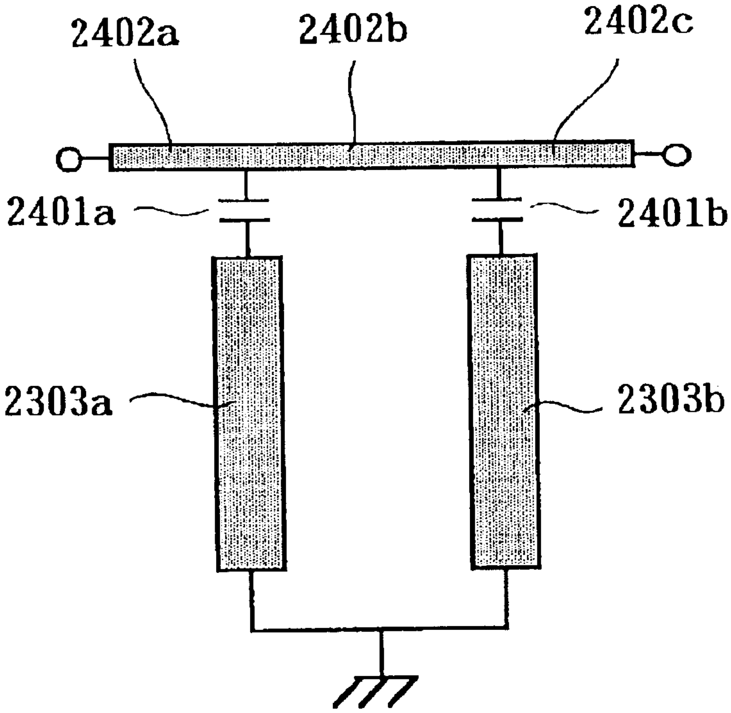
FIG. 11 is an equivalent circuit diagram of the laminated filter according to Embodiment B2 of the present invention.

Here, FIG. 11 shows an equivalent circuit of the laminated filter according to Embodiment B2 of the present invention. An operation of the laminated filter according to Embodiment B2 of the present invention will be explained with reference to the equivalent circuits in FIG. 10 and FIG. 11.

Since the resonator electrodes 2303*a* and 2303*b* are grounded through the end face electrode 2305*d*, they act as a one quarter-wavelength resonator. The transmission line electrode 2304 is placed facing part of the resonator electrode 2303*a* and part of the resonator electrode 2303*b*, forming capacitors 2401*a* and 2401*b* that act as notch capacitances.

Furthermore, these capacitors 2401*a* and 2401*b* are connected by transmission lines 2402*a*, 2402*b* and 2402*c* that correspond to the parts not facing the resonator electrodes 2303*a* and 2303*b* of the transmission line electrodes.

Thus, the dielectric filter according to Embodiment B2 operates as a band stop filter.

As shown above, this embodiment forms via holes in the dielectric layer at the bottom of the dielectric, connects the shield electrode and the grounding electrode through the via holes, and can thereby provide grounding with the entire bottom surface of the dielectric and realize a band stop filter with a sharp attenuation characteristic.

Furthermore, providing grounding with the grounding electrode of the entire bottom surface increases folding resistance and also increases resistance in drop tests compared to the conventional structure.

The grounding electrode 2307 has been described as a flat plate in the above explanations, but using a mesh-, band- or spider's web-like grounding electrode can reduce warpage due to the electrode leaning to the bottom surface while keeping the same attenuation characteristic.

Furthermore, the grounding electrode has been described to be provided on the bottom surface of the dielectric, but it can also be placed on the top surface and connected to the shield electrode through via holes in the same way as in the case of the bottom side.

This embodiment has described a two-stage band stop filter, but similar effects will also be obtained with a filter having three or more stages and it is possible to have five or more dielectric layers in this case.

Furthermore, using the laminated filter of each embodiment of the present invention as an antenna duplexer that switches between transmission and reception frequencies of a communication device such as a cellular phone allows the desired characteristic to be realized with a limited size, also contributing to miniaturization of the communication device. In that case, adopting a configuration with (BPF for RX, BEF for TX) will further improve the effect.

Furthermore, using the laminated filter of each embodiment of the present invention for of a communication device such as a cellular phone can realize a structure with excellent reliability such as folding resistance, also contributing to reliability of the communication device.

Furthermore, the laminated electronic component of the present invention has been described as a laminated filter, but the present invention is not limited to this and can also be any electronic part other than a filter such as a balun and coupler.

As described above, the present invention forms via holes in the dielectric layers, connects the shield electrode and grounding electrode through the via holes, and can thereby have a desired attenuation characteristic and provide a filter with excellent reliability.

Furthermore, the above-described embodiment has described as an example of the first terminal electrode of the present invention, the case where the end face electrode 2106*d*, etc. is electrically connected to the end face electrodes 2106*c* and 2106*e* that correspond to the second grounding electrode of the present invention. However, the present invention is not limited to this and the first terminal electrode can also be provided on the side of each dielectric layer in such a way that it is surrounded by the second grounding electrode.

The above-described embodiment has described the case where the second terminal electrode of the present invention connected to the coupling electrode (e.g., capacitor electrodes 2104*a* and 2104*b*) is provided as the end face electrodes 2107*a* and 2107*b* on the side of the laminated electronic component (see FIG. 8), but the present invention is not limited to this and the above-described second terminal electrode can also have the following configuration, for example.

That is, in this case, the above-described second terminal electrode is (1) formed on the other principal plane of the above-described dielectric layer A of the laminated electronic component of the present invention and/or on the above-described one principal plane of the above-described dielectric layer D in such a way that the second terminal electrode is not electrically connected to the above-described first grounding electrode, and (2) electrically connected to the above-described coupling electrode through a via hole different from the above-described via hole.

Here, the above-described laminated electronic component of the present invention comprises, for example, a dielectric layer A provided with a first shield electrode on one principal plane, a dielectric layer C which is a dielectric layer indirectly placed above the above-described dielectric layer A and provided with a second shield electrode on one principal plane, a dielectric layer D whose at least one principal plane is exposed outside, a dielectric layer B placed between the above-described dielectric layer A and above-described dielectric layer C including an inner circuit, and a first grounding electrode provided on the other principal plane of the above-described dielectric layer A or the one principal plane of the above-described dielectric layer D, wherein a via hole is provided in at least one of the above-described dielectric layer A or the above-described dielectric layer D, the above-described first shield electrode and the above-described second shield electrode are electrically connected, the above-described first grounding electrode and the above-described first shield electrode are electrically connected through via holes provided on the above-described dielectric layer A or the above-described first grounding electrode and the above-described second shield electrode are electrically connected through via holes provided on the above-described dielectric layer D, the above-described dielectric layer B further includes a coupling electrode provided facing part of the above-described resonator electrode as the above-described inner circuit, and the above-described laminated electronic component comprises a second terminal electrode connected to the above-described coupling electrode.

Figure 22:
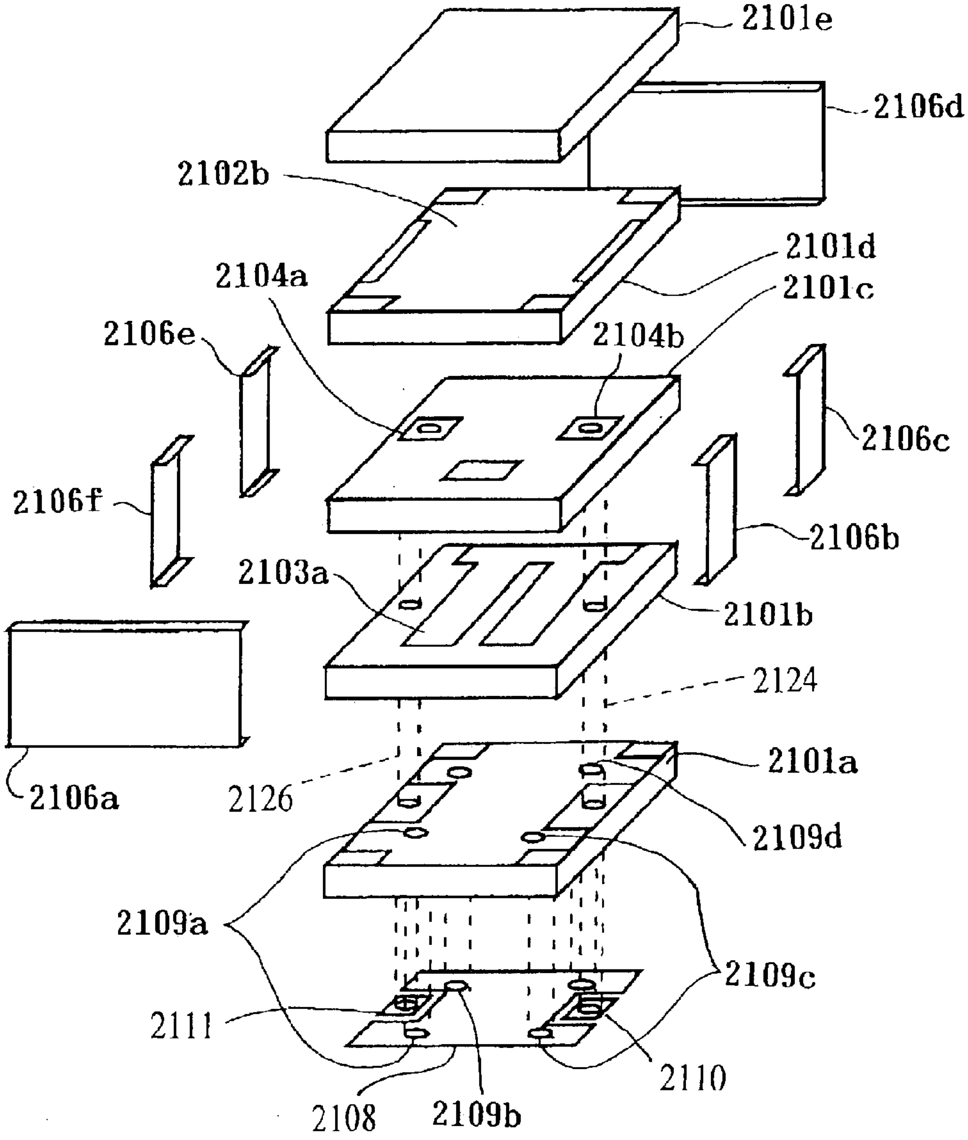
FIG. 22 is an exploded perspective view of the laminated filter according to Embodiment B1 of the present invention.
Figure 23:
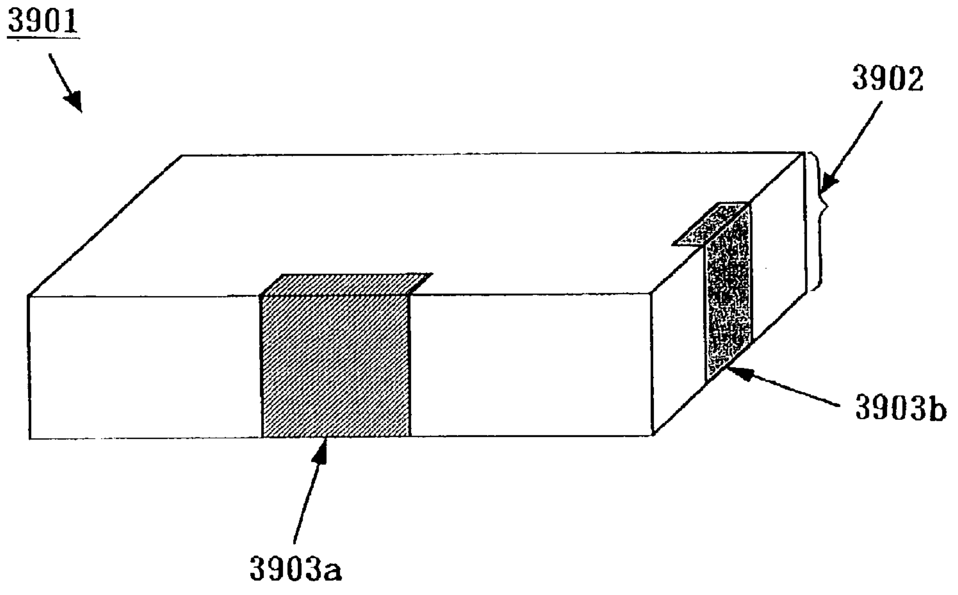
FIG. 23 is a perspective view of a conventional laminated electronic component.

More specifically, the laminated electronic component in such a configuration comprises second terminal electrodes 2111 and 2110 as shown in FIG. 22 which are (1) formed on the lower principal plane of the dielectric layer 2101*a* in such a way that they are not electrically connected to the first grounding electrode 2108, and (2) electrically connected to the capacitor electrodes 2104*a* and 2104*b* through via holes 2126 and 2124 which are different from the via holes 2109*a* to 2109*d*. The rest of the configuration is basically the same as the configuration shown in FIG. 8.

The laminated electronic component in the configuration shown in FIG. 22 allows the areas of the end face electrodes 2111 and 2110 connected to the capacitor electrodes 2104*a* and 2104*b* of the inner circuit to become smaller than the areas of the end face electrodes 2107*a* and 2107*b* shown in FIG. 8.

This has the effect of suppressing parasitic components such as a conductance component or inductance component generated on these end face electrodes (external terminal electrodes).

Furthermore, the above-described laminated electronic component can provide the end face electrodes 2111 and 2110 on the lower principal plane of the dielectric layer 2101*a*, unify grounding electrodes on each side of the laminated electronic component, for example, unifying the second grounding electrodes (end face electrodes 2106*b, c, e, f*) such as the electrodes 2106*b* and 2106*c*, and the electrodes 2106*e* and 2106*f*, thus increasing the areas of the electrodes.

This makes it possible to further increase the areas of the grounding electrodes, thus having the effect of further increasing electrical grounding strength.

(Embodiment C1)

Figure 14:
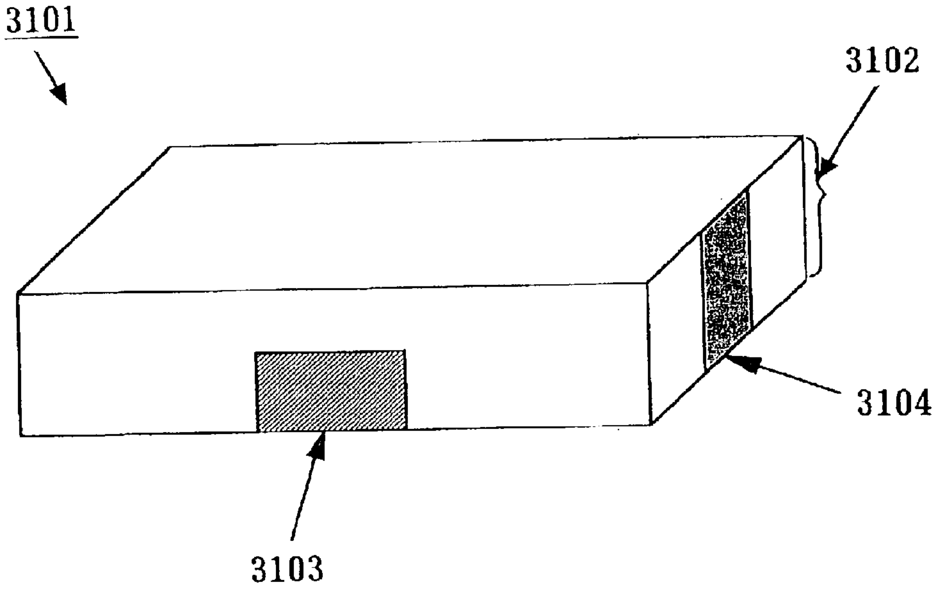
FIG. 14 is a laminated electronic component diagram according to Embodiment C1 of the present invention.

FIG. 14 shows a configuration of a laminated electronic component according to Embodiment C1 of the present invention.

In FIG. 14, the laminated electronic component 3101 according to Embodiment C1 of the present invention is a laminated body 3102 consisting of a plurality of laminated dielectric sheets and an inner layer of the laminated body 3102 includes an inner circuit (not shown) having input/output terminals and an inner grounding electrode (not shown).

The dielectric sheet is made of a crystal phase and glass phase having a specific inductive capacity $\in_r=7$ and dielectric loss tan $\delta=2.0\times10^{-4}$. On the sides of the laminated body 3102, an external terminal electrode 3103 electrically connected to the input/output terminal of the inner circuit and an external grounding electrode 3104 electrically connected to the inner grounding electrode are formed.

At this time, the external terminal electrode 3103 electrically connected to the input/output terminal of the inner circuit is formed so that its height is smaller than the height of the external grounding electrode 3104 connected to the inner grounding electrode.

That is, the external grounding electrode 3104 is formed on the side of the laminated body 3102 extending from the top surface to the bottom surface of the laminated body 3102. On the other hand, the external terminal electrode 3103 is formed on the side of the laminated body 3102 extending from the middle part to the bottom surface.

The external terminal electrode 3103 and external grounding electrode 3104 are assumed to have approximately the same breadth. Thus, this laminated electronic component is formed in such a way that the area of the external terminal electrode 3103 becomes smaller than that of the conventional one depending on the difference in the heights of electrodes.

Here, it is not always necessary that the external terminal electrode 3103 and external grounding electrode 3104 have approximately the same breadth.

Having such a configuration, the laminated electronic component according to Embodiment C1 of the present invention can suppress deterioration of characteristics due to parasitic components such as a conductance component or inductance component of the external terminal electrode electrically connected to the input/output terminal of the inner circuit.

Figure 15:
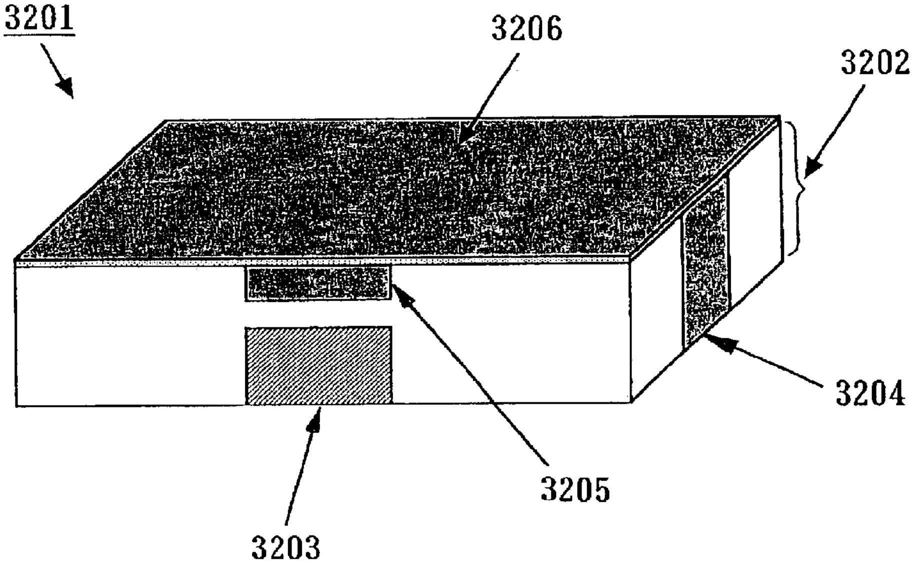
FIG. 15 illustrates another mode of the laminated electronic component according to Embodiment C1 of the present invention.

By the way, the laminated electronic component of the present invention can also have a configuration shown in FIG. 15.

In FIG. 15, the laminated electronic component 3201 according to the present invention is a laminated body 3202 consisting of a plurality of laminated dielectric sheets and an inner layer of the laminated body includes an inner circuit (not shown) having input/output terminals and an inner grounding electrode (not shown)

On the sides of the laminated body 3202, an external electrode 3203 electrically connected to the input/output terminal of the inner circuit and an external electrode 3204 electrically connected to the inner grounding electrode are formed. The external electrode 3203 electrically connected to the input/output terminal of the inner circuit is formed in such a way that its height is smaller than the height of the external grounding electrode 3204 which is electrically connected to the inner grounding electrode.

Furthermore, the external grounding electrode 3204 is formed on the side of the laminated body 3202 extending from the top surface to the bottom surface of the laminated body 3202. On the other hand, the external terminal electrode 3203 is formed on the side of the laminated body 3202 extending from the middle part to the bottom surface.

Furthermore, the upper area of the external terminal electrode 3203 includes a lead-out side electrode 3205 led out from the top surface of the laminated body 3202 and the lead-out side electrode 3205 is connected to the inner grounding electrode.

Furthermore, an external shield electrode 3206 is provided on the top surface of the laminated body 3202 to which the external grounding electrode 3204 and lead-out side electrode 3205 are connected.

Having such a configuration, the laminated electronic component according to the present invention can suppress deterioration of characteristics due to parasitic components such as a conductance component or inductance component of the external terminal electrode electrically connected to the input/output terminal and has the effect of improving the shielding effect.

By the way, the lead-out side electrode 3205 need not always be connected to both the inner grounding electrode of the laminated body 3202 and the external shield electrode 3206, and can also be connected to only one of the inner grounding electrode or the external shield electrode 3206 and electrically grounded.

The number of external terminal electrodes, external grounding electrodes and lead-out side electrodes and the locations of the sides on which those electrodes are placed in this embodiment are not limited to those in FIG. 14 and FIG. 15, but can be arbitrarily adapted according to the layout and configuration of the inner circuit of the laminated body and inner grounding electrode and any external electrode can be formed extending at least from the bottom surface of the laminated body.

Furthermore, this embodiment has been described to have one inner grounding electrode, but even if there is a plurality of inner grounding electrodes, it is possible to provide via holes in the laminated body to connect the inner grounding electrodes or connect them to the external grounding electrodes and thereby make those electrodes have the same potential, and increasing the number of inner grounding electrodes also leads to strengthening of grounding and improvement of the shielding effect.

Furthermore, this embodiment adopts a configuration that the external grounding electrodes 3104 and 3204 to be connected to the inner grounding electrode are formed extending from the top surface to the bottom surface of the laminated bodies 3102 and 3202, but the present invention is not limited to this and similar effects can be obtained if the heights of the external terminal electrodes 3103 and 3203 connected to the input/output terminals of the inner circuit are smaller than the heights of the external grounding electrodes 3104 and 3204 connected to the inner grounding electrode.

However, it is desirable at this time that the external terminal electrode 3103 or 3203 and the external grounding electrode 3104 or 3204 have approximately the same breadth.

Furthermore, this embodiment has described, as an example, a dielectric sheet made of a crystal phase and glass phase having a specific inductive capacity $\in_r=7$ and dielectric loss tan $\delta=2.0\times10^{-4}$. Similar effects can be obtained even if a dielectric sheet made of a crystal phase and glass phase having a specific inductive capacity $\in_r=5$ to 10 is used.

Furthermore, similar effects can also be obtained even if a dielectric sheet whose main components are $Bi_2O_3$, $Nb_2O_5$ with a specific inductive capacity $\in_r=50$ to 100 is used.

The second grounding electrode of the present invention corresponds to the external grounding electrode 3104, etc. of the above-described embodiment, while the external terminal electrode of the present invention corresponds to the external terminal electrode 3103, etc.

(Embodiment C2)

Figure 16:
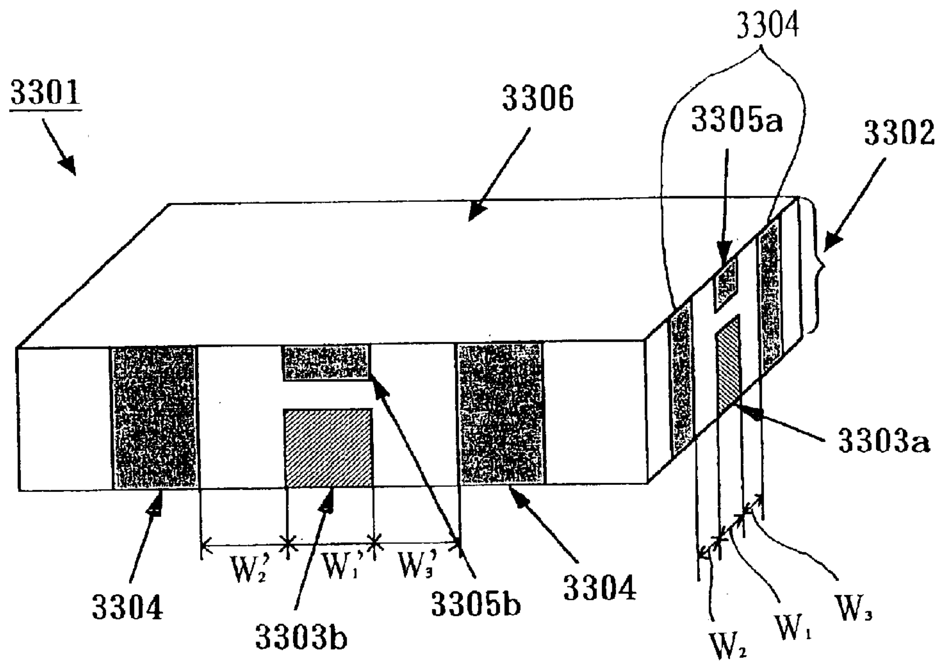
FIG. 16 is a laminated electronic component diagram according to Embodiment C2 of the present invention.

FIG. 16 shows a configuration of a laminated electronic component according to Embodiment C2 of the present invention.

In FIG. 16, the laminated electronic component 3301 according to Embodiment C2 of the present invention is a laminated body 3302 consisting of a plurality of laminated dielectric sheets and an inner layer of the laminated body includes an inner circuit (not shown) having input/output terminals and an inner grounding electrode (not shown).

The dielectric sheet is made of a crystal phase and glass phase having a specific inductive capacity $\in_r=7$ and dielectric loss tan $\delta 2.0\times10^{-4}$.

On the sides of the laminated body 3302, an external input terminal electrode 3303*a* electrically connected to the input terminal of the inner circuit, an external output terminal electrode 3303*b* electrically connected to the output terminal of the inner circuit and an external grounding electrode 3304 electrically connected to the inner grounding electrode are formed.

At this time, the external input terminal electrode 3303*a* and the external output terminal electrode 3303*b* are formed in such a way that their heights are smaller than the height of the external grounding electrode 3304.

Furthermore, the external grounding electrode 3304 is formed on both sides of the external input terminal electrode 3303*a* and external output terminal electrode 3303*b*, extending from the top surface to the bottom surface of the laminated body 3302.

The external input terminal electrode 3303*a* is formed on the side of the laminated body 3302 extending from the middle part to the-bottom surface. The upper area of the external input terminal electrode 3303*a* on the above-described side includes a lead-out side electrode 3305*a* led out from the top surface of the laminated body 3302 and the lead-out side electrode 3305*a* is connected to the inner grounding electrode.

Furthermore, the external output terminal electrode 3303*b* is formed on the side of the laminated body 3302 extending from the middle part to the bottom surface. The upper area of the external output terminal electrode 3303*b* includes a lead-out side electrode 3305*b* led out from the top surface of the laminated body 3302 and the lead-out side electrode 3305*b* is connected to the inner grounding electrode.

In the above-described configuration, the external terminal electrode 3303 and the external grounding electrode 3304 are assumed to have approximately the same breadth.

Figure 17:
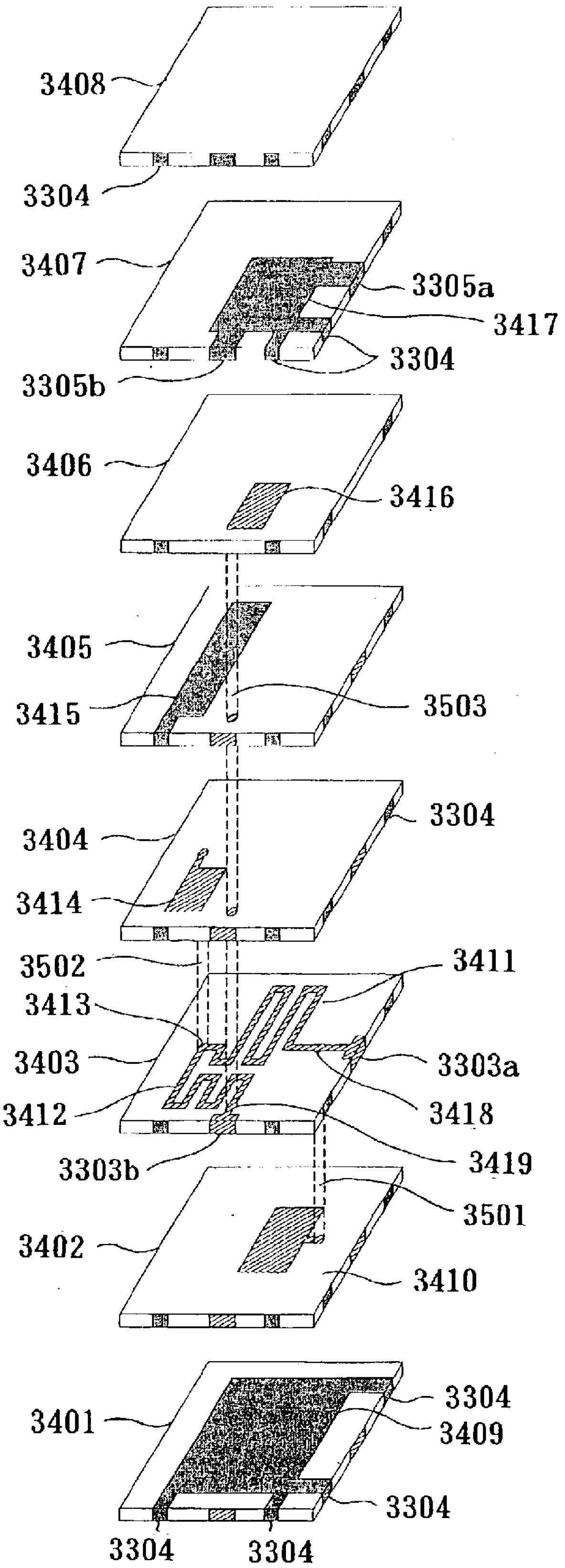
FIG. 17 is an exploded perspective view of a laminated electronic component according to Embodiment C2 of the present invention.

FIG. 17 is an exploded perspective view of the laminated electronic component 3301 shown in FIG. 16.

As shown in FIG. 17, the laminated electronic component 3301 consists of dielectric layer 3401 to dielectric layer 3408 placed one atop another in numbering order. The dielectric layer 3401 is provided with an inner grounding electrode 3409 and the dielectric layer 3402 is provided with a capacitor electrode 3410.

Furthermore, the dielectric layer 3403 is provided with a strip line 3411 and a strip line 3412 and are connected at a connection point 3413. The dielectric layers 3404, 3405, 3406 and 3407 are provided with a capacitor electrode 3414, an inner grounding electrode 3415, a capacitor electrode 3416 and an inner grounding electrode 3417 respectively.

Furthermore, the capacitor electrode 3410 is connected to a connection point 3418 of the strip line 3411 through a via hole 3501 and the capacitor electrode 3414 is connected to the connection point 3413 through a via hole 3502.

Furthermore, the capacitor electrode 3416 is connected to a connection point 3419 of the strip line 3412 through a via hole 3503.

Furthermore, the inner grounding electrodes 3415 and 3417 are connected to the inner grounding electrode 3409 through the external grounding electrode 3304 formed on the side of the laminated electronic component. Furthermore, with regard to the input terminal of the inner circuit, one end of the strip line 3411 is led out to the end face of the laminated electronic component and connected to the external input terminal electrode 3303*a* formed on the side of the laminated electronic component.

On the other hand, with regard to the output terminal of the inner circuit, one end of the strip line 3412 is led out to the end face of the laminated electronic component and connected to the external output terminal electrode 3303*b* formed on the side of the laminated electronic component.

Furthermore, the inner grounding electrode 3417 is connected to the lead-out side electrode 3305*a* and the lead-out side electrode 3305*b*. However, for simplicity in the above-described explanation, the positions of via holes in the figure are schematically expressed with dotted line on the exploded perspective view in principle.

Figure 18:
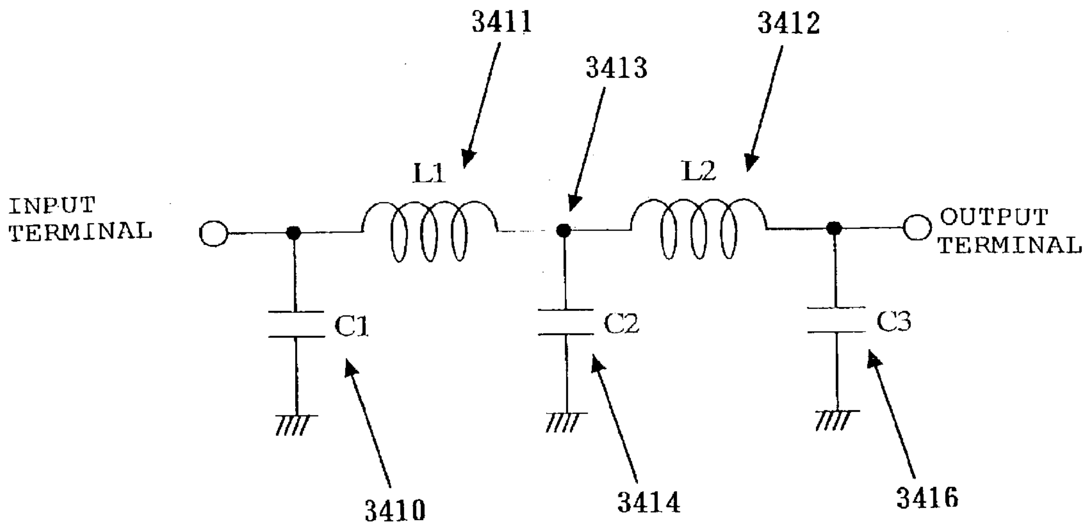
FIG. 18 is an equivalent circuit diagram of an inner circuit of the laminated electronic component according to Embodiment C2 of the present invention.

FIG. 18 is an equivalent circuit of the laminated electronic component in FIG. 17 and the elements that correspond to those in FIG. 17 are assigned the same reference numerals. A capacitance C1 is formed between the capacitor electrode 3410 and inner grounding electrode 3409 and a capacitance C2 is formed between the capacitor electrode 3414 and grounding electrode 3415.

Furthermore, a capacitance C3 is formed between the capacitor electrode 3416 and grounding electrode 3417 and inductances L1 and L2 are formed of strip lines 3411 and 3412 respectively. L1 is connected in series with the external input terminal electrode 3303*a* and C1 is connected in parallel with the external input terminal electrode 3303*a* and L2 is connected in series with the external output terminal electrode 3303*b* and C3 is connected in parallel with the external output terminal electrode 3303*b*.

Furthermore, connecting L1 and L2 in series and C2 in parallel at the connection point 3413 constitutes a low bandpass type filter with 5 elements.

By adopting the above-described configuration, the laminated electronic component according to Embodiment C2 of the present invention can suppress deterioration of characteristics due to parasitic components such as a conductance component or inductance component of the external input terminal electrode 3303*a* electrically connected to the input terminal of the inner circuit and the external output terminal electrode 3303*b* electrically connected to the output terminal of the inner circuit and at the same time improve the shielding effect of the external electrodes 3304 placed on both sides of the external input terminal electrode 3303*a* and the external output terminal electrode 3303*b*, thereby suppressing deterioration of characteristics due to spatial electric coupling.

Figure 19:
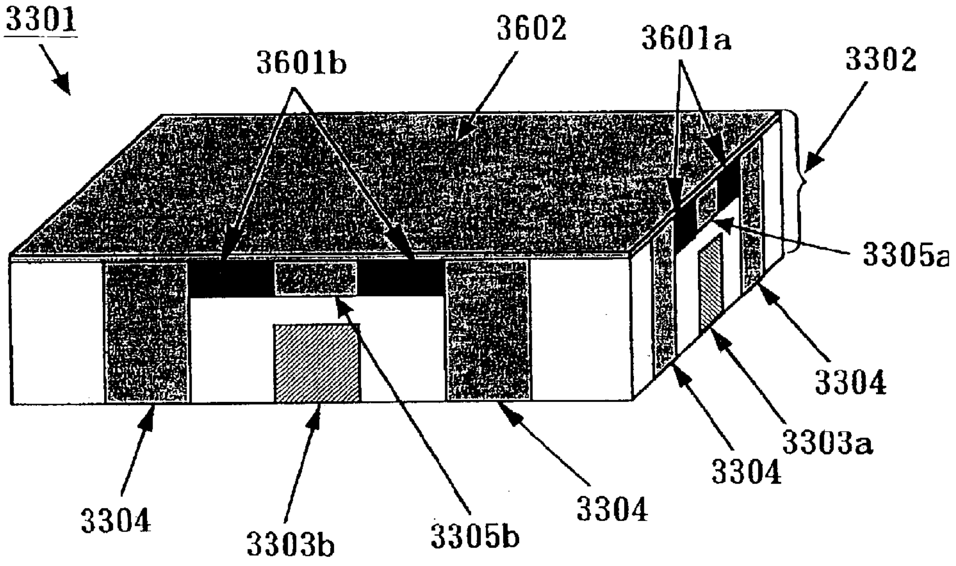
FIG. 19 illustrates another mode of the laminated electronic component according to Embodiment C2 of the present invention.

In the laminated electronic component 3301 of this embodiment, as shown in FIG. 19, it is also possible to place the external shield electrode 3602 on the top surface of the laminated body 3302. In this case, the shielding effect of the laminated electronic component 3301 is improved.

By the way, as shown in FIG. 19, it is also possible to adopt a configuration so that the lead-out external electrodes 3305*a* and 3305*b* are connected to the external grounding electrodes 3304 which are electrically connected to the inner grounding electrode by means of connection electrodes 3601*a* and 3601*b*. In this case, the shielding effect is expected to improve further.

In this embodiment, as shown in FIG. 16, it is desirable that distances $W_2$ and $W_3$ between the external terminal electrode 3303*a* and the external grounding electrodes 3304 placed on both sides be equal to or greater than the electrode width $W_1$ of the external terminal electrode 3303*a*.

Furthermore, the same applies to the relationship between distances $W_2$ and $W_3$ between the external terminal electrode 3303*b* and the external grounding electrodes 3304 placed on both sides and the electrode width $W_1$ of the external terminal electrode 3303*b*.

The number of external terminal electrodes, external grounding electrodes and lead-out side electrodes and the locations of the sides on which those electrodes are placed are not limited to this, but can be adapted according to the inner circuit of the laminated body and inner grounding electrode and any external electrode can be formed extending at least from the bottom surface of the laminated body.

Furthermore, this embodiment has described the inner circuit as a low bandpass type filter, but can be a different circuit configuration and there can be a plurality of inner circuits instead of one.

Furthermore, this embodiment has described the inner grounding circuit as a single circuit, but even if there is a plurality of inner grounding electrodes, it is only necessary to keep them at the same potential by connecting them through via holes in the laminated body or connecting them using the external grounding electrodes, and increasing the number of inner grounding electrodes also leads to the increase of grounding strength and improvement of the shielding effect.

The lead-out side electrodes 3305*a* and 3305*b* need not always be connected to the inner grounding electrode of the laminated body 3302 if they are at least connected to the external shield electrode 3206 and electrically grounded.

This embodiment has described, as an example of the dielectric layer 3401 to dielectric layer 3408, a dielectric sheet made of a crystal phase and glass phase having a specific inductive capacity $\epsilon_r$=7 and dielectric loss tan $\delta=2.0\times10^{-4}$. Similar effects can also be obtained even if a dielectric sheet made of a crystal phase and glass phase having a specific inductive capacity $\epsilon_r$=5 to 10 is used. Furthermore, similar effects can also be obtained even if a dielectric sheet whose main components are $Bi_2O_3$, $Nb_2O_5$ with a specific inductive capacity $\epsilon_r$=50 to 100 is used.

An example of the first shield electrode according to claim 11 of the present invention corresponds to the inner grounding electrode 3409 of the above-described embodiment, while an example of the second shield electrode of the present invention corresponds to the inner grounding electrode 3417.

(Embodiment C3)

Figure 20:
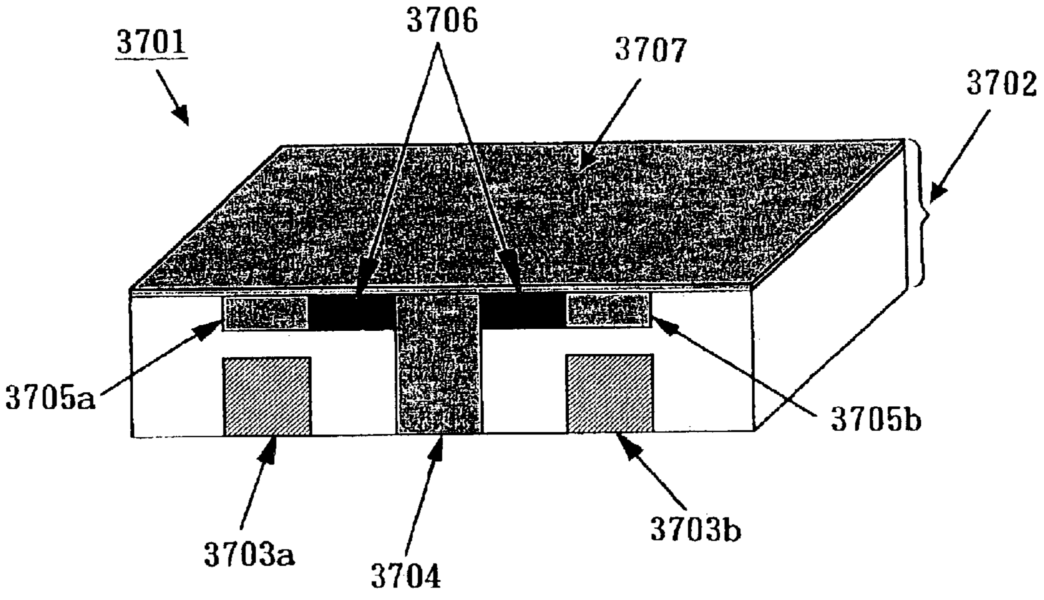
FIG. 20 is a laminated electronic component diagram according to Embodiment C2 of the present invention.

FIG. 20 shows a laminated electronic component according to Embodiment C3 of the present invention.

In FIG. 20, the laminated electronic component 3701 according to Embodiment C3 of the present invention is a laminated body 3702 consisting of a plurality of laminated dielectric sheets and an inner layer of the laminated body includes an inner circuit (not shown) having input/output terminals and an inner grounding electrode (not shown).

The dielectric sheet is made of a crystal phase and glass phase having a specific inductive capacity $\epsilon_r$=7 and dielectric loss tan $\delta=2.0\times10^{-4}$. On the sides of the laminated body 3702, an external-input terminal electrode 3703*a* electrically connected to the input terminal of the inner circuit, an external output terminal electrode 3703*b* electrically connected to the output terminal of the inner circuit and an external grounding electrode 3704 electrically connected to the inner grounding electrode are formed.

At this time, the external input terminal electrode 3703*a* and the external output terminal electrode 3703*b* are formed in such a way that their heights are smaller than the height of the external grounding electrode 3704.

Furthermore, the external input terminal electrode 3703*a* and the external output terminal electrode 3703*b* are placed on the same side of the laminated body 3702 and the external grounding electrode 3704 is placed for connection with the external input terminal electrode 3703*a* and the external output terminal electrode 3703*b*.

The external grounding electrode 3704 is formed extending from the top surface to the bottom surface of the laminated body 3702. The external input terminal electrode 3703*a* is formed on the side of the laminated body 3702 extending from the middle part to the bottom surface.

The upper area of the external input terminal electrode 3703*a* includes a lead-out side electrode 3705*a* led out from the top surface of the laminated body 3702 and the lead-out side electrode 3705*a* is connected to the inner grounding electrode.

Furthermore, the external output terminal electrode 3703*b* is formed on the side of the laminated body 3702 extending from the middle part to the bottom surface. The upper area of the external output terminal electrode 3703*b* includes a lead-out side electrode 3705*b* led out from the top surface of the laminated body 3702 and the lead-out side electrode 3705*b* is connected to the inner grounding electrode.

In the above-described configuration, the external terminal electrode 3703, the external grounding electrode 3704 and the lead-out side electrode 3705 are assumed to have approximately the same breadth.

By adopting the above-described configuration, the laminated electronic component according to Embodiment C3 of the present invention can secure isolation between the external input terminal electrode 3703*a* and the external output terminal electrode 3703*b* even if the external input terminal electrode 3703*a* and the external output terminal electrode 3703*b* are placed on the same side of the laminated body 3702.

Furthermore, it is also possible to adopt a configuration that the lead-out side electrodes 3705*a* and 3705*b* are connected to the external grounding electrodes 3704 which is electrically connected to the inner grounding electrode by means of connection electrode 3706. In this case, the shielding effect is expected to be improved further.

Furthermore, the external grounding electrode 3704 or the lead-out side electrodes 3705*a* and 3705*b* can also be connected to the external shield electrode 3707. In this case, not only securing of isolation but also an improvement of the shielding effect can be expected.

It is desirable that distances between the external input terminal electrode 3703*a* electrically connected to the input terminal of the inner circuit, the external output terminal electrode 3703*b* electrically connected to the output terminal of the inner circuit and the external grounding electrode 3704 electrically connected to the inner grounding electrode be equal to or greater than the electrode widths of the external input terminal electrode 3703*a* and the external output terminal electrode 3703*b*.

This embodiment adopts a configuration that the external input terminal electrode 3703*a* and the inner circuit are placed on the same side of the laminated body 3702, but the present invention is not limited to this and even if a plurality of external terminal electrodes of the inner circuit is placed on the same side, similar effects can be obtained if an external grounding electrode is placed between the external terminal electrodes.

The number of external terminal electrodes, external grounding electrodes and lead-out side electrodes and the locations of the sides on which those electrodes are placed are not limited to this, but can be adapted according to the inner circuit of the laminated body and inner grounding electrode and the present invention is applicable if some terminal or external electrode is formed at least extending from the bottom surface of the laminated body.

Furthermore, this embodiment has described the inner grounding electrode as a single electrode, but even if there is a plurality of inner grounding electrodes, it is only necessary to keep them at the same potential by connecting them through via holes in the laminated body or connecting them using the external grounding electrodes and increasing the number of inner grounding electrodes also leads to the increase of the grounding strength and improvement of the shielding effect.

The lead-out side electrodes 3705*a* and 3705*b* need not always be connected to the inner grounding electrode of the laminated body 3702 if they are at least connected to the external shield electrode 3707 and electrically grounded.

This embodiment has described, as an example of the dielectric layer 3101 to dielectric layer 3108, a dielectric sheet made of a crystal phase and glass phase having a specific inductive capacity $\in_r=7$ and dielectric loss tan $\delta=2.0\times10^{-4}$. Similar effects can also be obtained even if a dielectric sheet made of a crystal phase and glass phase having a specific inductive capacity $\in_r$5 to 10 is used.

Furthermore, similar effects can also be obtained even if a dielectric sheet whose main components are $Bi_2O_3$, $Nb_2O_5$ with a specific inductive capacity $\in_r$50 to 100 is used. Furthermore, the number of dielectric layers is not limited to this, either.

Figure 21A:
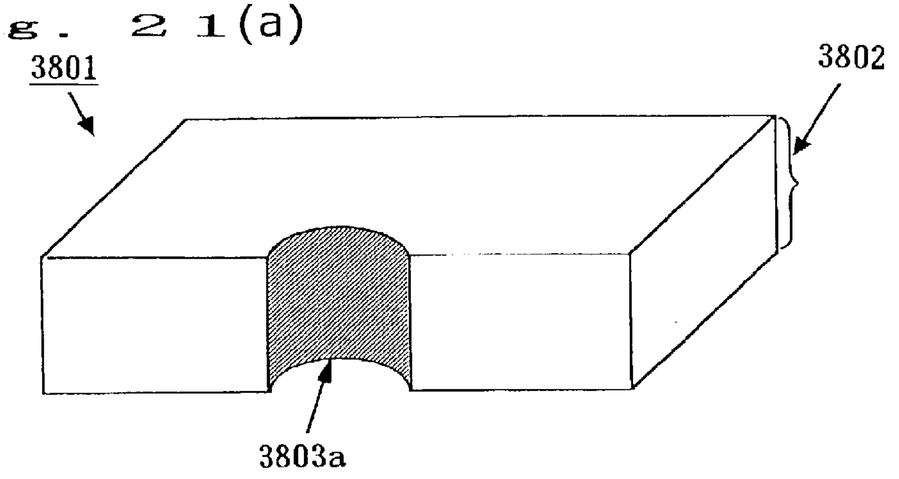
FIG. 21A is a schematic view of an external electrode according to Embodiments C1 to C3 of the present invention.

Furthermore, the external grounding electrodes 3104, 3204, 3304 and 3704 connected to the inner grounding electrode explained in Embodiments C1 to C3 can also be an external electrode 3803*a* buried in the laminated body 3802 in the laminated electronic component 3801 as shown in FIG. 21A, constructed by perforating a hole in the laminated body 3802 using a drill, etc. and applying an conductive material or plating, etc. after the laminated body 3802 is formed.

Figure 21B:
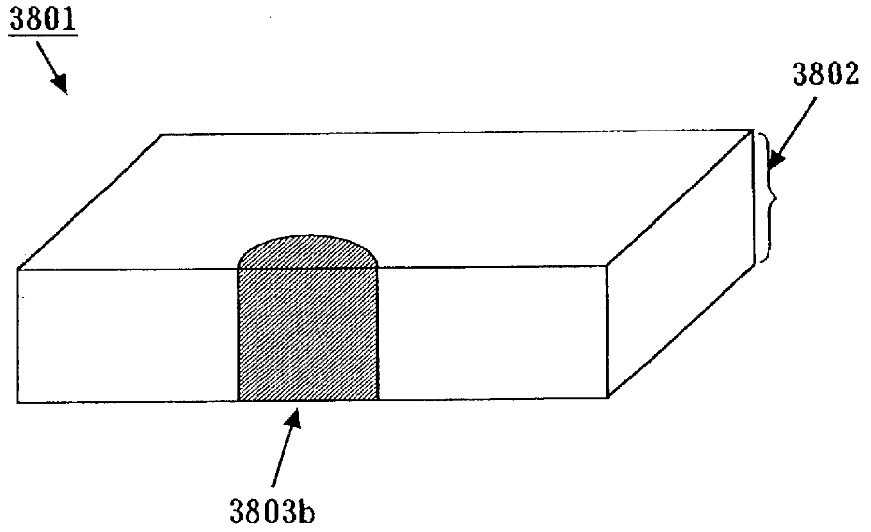
FIG. 21B is another schematic view of the external electrode according to Embodiments C1 to C3 of the present invention.

Furthermore, as shown in FIG. 21B, the external grounding electrodes 3104, 3204, 3304 and 3704 can also be an external electrode 3803*b* buried in the laminated body 3802 in the laminated electronic component 3801, constructed by forming an electrode pattern by printing, etc. on the dielectric sheets that make up the laminated body 3802.

Figure 21C:
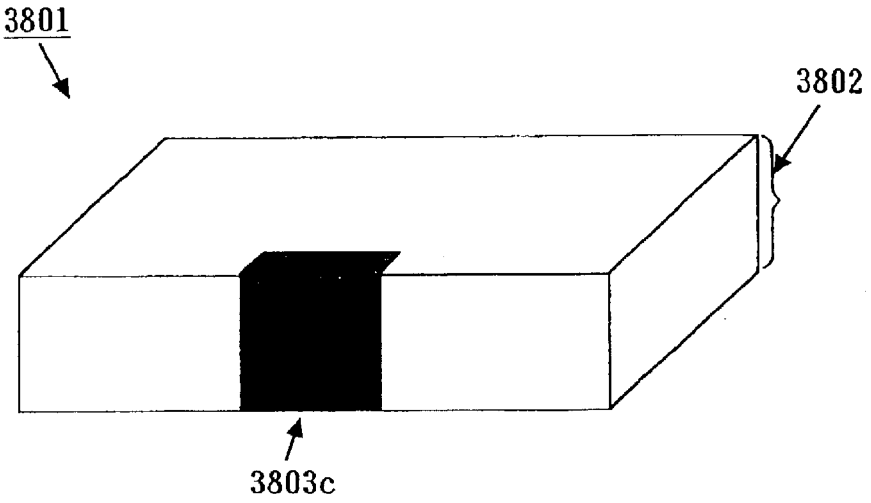
FIG. 21C is a further schematic view of the external electrode according to Embodiments C1 to C3 of the present invention.

Furthermore, the external grounding electrodes 3104, 3204, 3304 and 3704 connected to the inner grounding electrode explained in Embodiments C1 to C3 can also be an external electrode 3803*c* as shown in FIG. 21C constructed outside the laminated body 3802 in the laminated electronic component 3801 by applying a conductive material such as silver paste after the laminated body 3802 is formed.

By the way, the external electrode 3803*c* has a form wrapping around the top surface of the laminated body 3802, but this can also be applied only to the side of the laminated body 3802.

The external terminal electrodes 3103, 3203, 3303*a*, 3303*b*, 3703*a* and 3703*b* connected to the input/output terminals of the inner circuit are formed in the same way as for the external electrodes 3803*a*, 3803*b* and 3803*c* in FIG. 21A to FIG. 21C. However, they are different in a configuration that the heights of the external terminal electrodes 3103, 3203, 3303*a*, 3303*b*, 3703*a* and 3703*b* are smaller than the heights of the external grounding electrodes 3104, 3204, 3304 and 3704.

Furthermore, the lead-out side electrodes 3205, 3305*a*, 3305*b*, 3705*a* and 3705*b*, and the connection electrodes 3601*a*, 3601*b* and 3706 are formed in the same way as for the external electrodes 3803*a*, 3803*b* and 3803*c* in FIG. 21A to FIG. 21C.

However, they are different in a configuration that the heights of the lead-out side electrodes 3205, 3305*a*, 3305*b*, 3705*a* and 3705*b*, and the connection electrodes 3601*a*, 3601*b* and 3706 are smaller than the heights of the external grounding electrodes 3104, 3204, 3304 and 3704.

Furthermore, the laminated electronic components explained in Embodiments C1 to C3 can also have a configuration that electronic part chips such as semiconductors, surface acoustic wave filters are integrated into a laminated body.

When used for a communication device, the laminated electronic components explained in Embodiments C1 to C3 can reduce the areas of terminals and reduce coupling with the patterns on the substrates or improved isolation between input and output has the effect of preventing inputs of unnecessary signals and improving performance.

It is an object of the laminated electronic component in the above-described configuration of the present invention to provide a laminated electronic component capable of suppressing deterioration of characteristics due to parasitic components such as a conductance component or inductance component by lowering the heights of the external terminal electrodes connected to the input/output terminal of at least one inner circuit compared the height of the external grounding electrode connected to the inner grounding electrode.

Furthermore, it is another object of the present invention to provide a laminated electronic component capable of reducing spatial coupling between the external terminal electrodes by placing external grounding electrodes connected to at least one inner grounding electrode between a plurality of external terminal electrodes connected to the input/output terminals of at least one inner circuit.

As described above, the laminated electronic component of the present invention is a laminated electronic component comprising a laminated body integrating a plurality of dielectric sheets placed one atop another, at least one inner circuit provided with input/output terminals and at least one inner grounding electrode in the inner layer of the above-described laminated body, wherein the input/output terminal of the above described inner circuit is electrically connected to the external terminal electrode formed on the side of the above-described laminated body, the above-described inner grounding electrode is electrically connected to the external grounding electrode formed on the side of the above-described laminated body, the above-described external terminal electrodes are lower than the above-described external grounding electrodes, thus suppressing deterioration of characteristics due to parasitic components such as a conductance component or inductance component.

Figure 12:
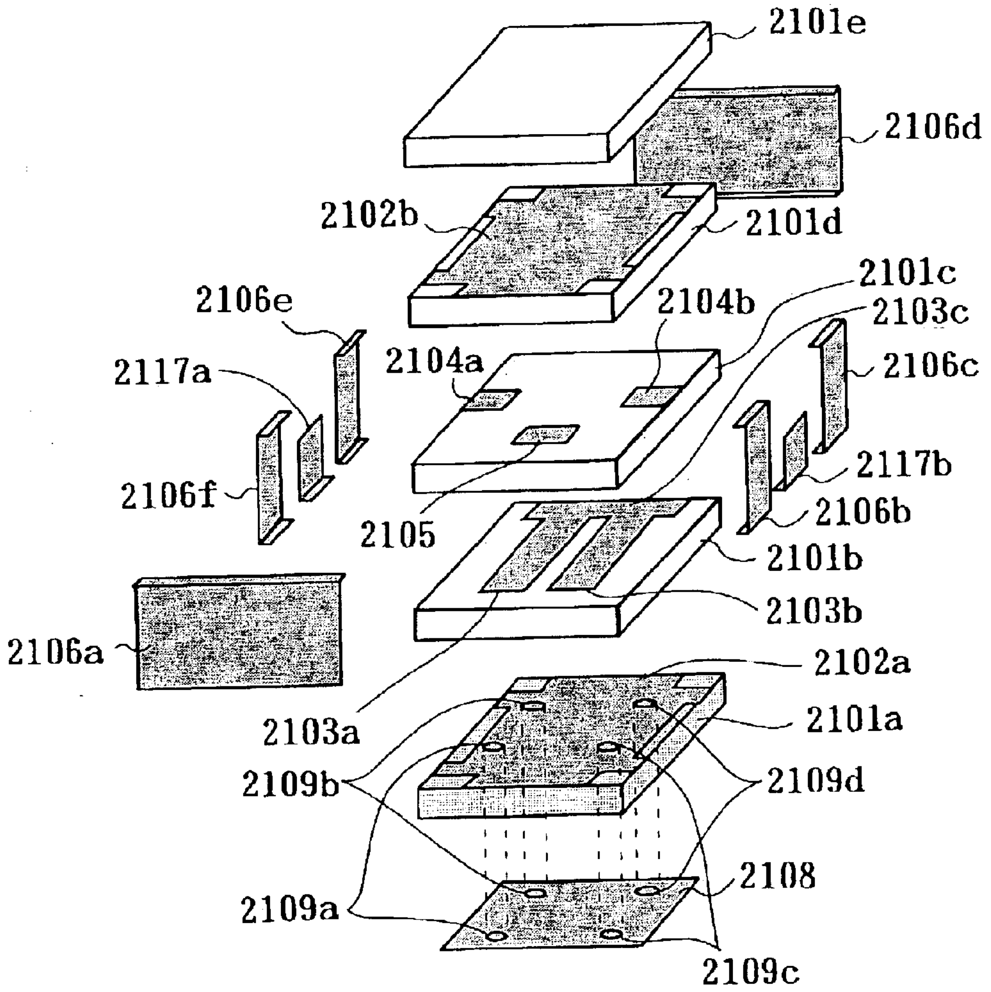
FIG. 12 is an exploded perspective view illustrating an example of a laminated filter applying a configuration according to Embodiment C1 to the configuration according to Embodiment B2 of the present invention.
Figure 13:
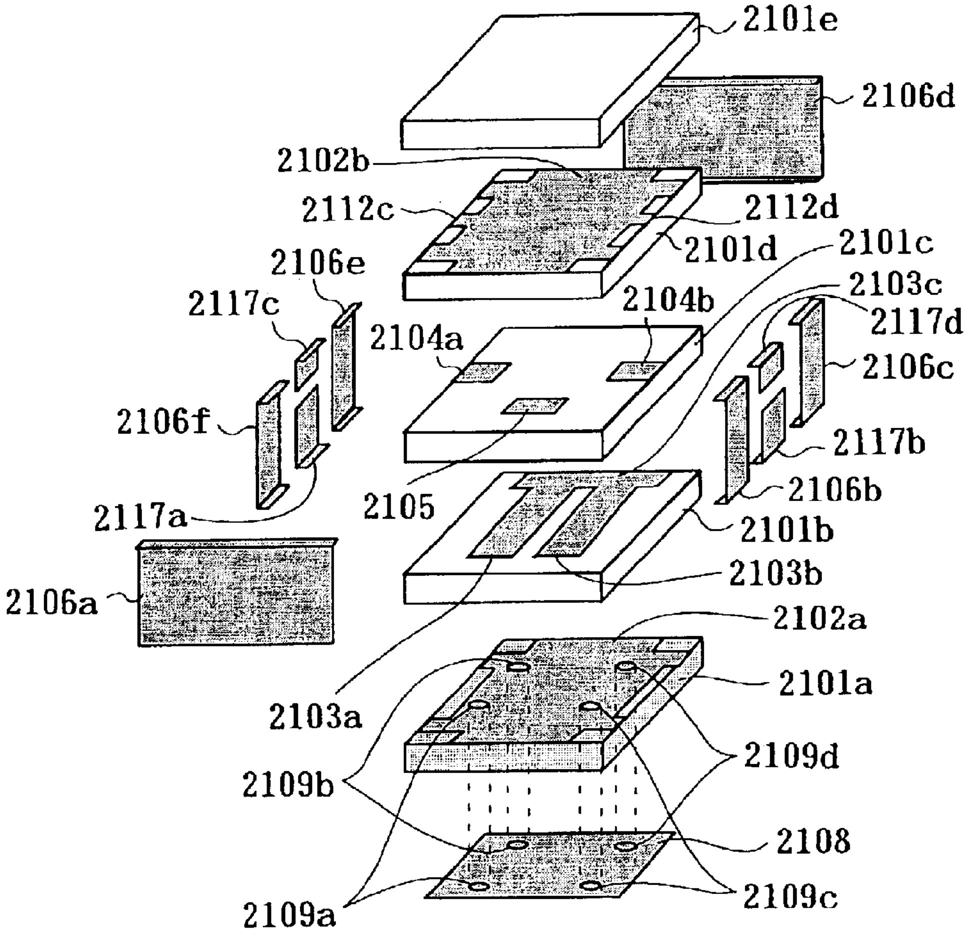
FIG. 13 is an exploded perspective view illustrating an example of a laminated filter applying a configuration according to Embodiment C2 to the configuration according to Embodiment B1 of the present invention.

The above-described Embodiments B1 and B2 have described the case where the end face electrodes 107*a* and 107*b*, etc., have the same height as that of the grounding electrodes 106*b* and 106*e*, etc., but it is also possible to combine above-described embodiments with any one of Embodiments C1 to C3 to have a configuration with both electrodes having different heights as shown in FIG. 12 and FIG. 13.

Here, FIG. 12 is an exploded perspective view to illustrate an example of applying the configuration of above-described Embodiment C1 to the configuration of above-described Embodiment B1.

The configuration in FIG. 12 is the same as the configuration in FIG. 8 except that the end face electrodes 2117*a* and 2117*b* have different heights. The upper edges of the end face electrodes 2117*a* and 2117*b* are connected to the capacitor electrodes 2104*a* and 2104*b* respectively.

In addition to an improvement of grounding strength, this configuration can suppress the generation of parasitic components such as a conductance component or inductance component in the end face electrodes 2117*a* and 2117*b*, and therefore has the effect of providing a laminated electronic component with excellent high frequency characteristics.

On the other hand, FIG. 13 is an exploded perspective view to illustrate an example of applying the configuration of above-described Embodiment C2 to the configuration of above-described Embodiment B1.

The configuration in FIG. 13 is the same as the configuration in FIG. 12 except that the additional end face electrodes 2117*c* and 2117*d* are formed and that the second shield electrode 2102*b* has a different shape. The lower edges of the end face electrodes 2117*c* and 2117*d* are connected to one connection electrode 2112*c* and the other connection electrode 2112*d* of the second shield electrode 2102*b* respectively.

Such a configuration produces similar effects to those explained in FIG. 13.

The above-described embodiment of the laminated electronic component of the present invention has described the case where the laminated electronic component is constructed as a laminated filter having five dielectric layers, but the present invention is not limited to this and can also have the following configuration, for example.

That is, the laminated electronic component in this case can be at least a laminated electronic component comprising:

a dielectric layer A provided with a first shield electrode on one principal plane, a dielectric layer B which is directly or indirectly placed on the above-described dielectric layer A and provided with a second shield electrode on the other principal plane, a dielectric layer D whose at least one principal plane is exposed outside, a dielectric layer B including an inner circuit, placed between the above-described dielectric layer B and the above-described dielectric layer D, and a first grounding electrode provided on the other principal plane of the above-described dielectric layer A or the above-described one main plain of the above-described dielectric layer D, wherein at least one of the above-described dielectric layer A and the above-described dielectric layer D is provided with via holes, the above-described first shield electrode and the above-described second shield electrode are electrically connected, the above-described first grounding electrode and the above-described first shield electrode are electrically connected through via holes provided on the above-described dielectric layer A or the above-described first grounding electrode and the above-described second shield electrode are electrically connected through via holes provided on the above-described dielectric layer D.

Therefore, the laminated electronic component of the present invention is not limited to the above-described embodiments in the number of dielectric layers, type of electronic parts, locations of the dielectric layers on which via holes are placed and other configurations.

The above-described embodiment of the laminated electronic component of the present invention has described the case where the first and second shield electrodes are provided, but the present invention is not limited to this and the second shield electrode can be excluded, for example.

The configuration in this case is basically the same as the configuration shown in FIG. 8 except that the fourth dielectric layer 2101*d* does not exist in the configuration of the laminated electronic component explained in above-described Embodiment B1.

Thus, the laminated electronic component in this case comprises a dielectric layer A with a first shield electrode provided on one principal plane, a dielectric layer D with at least one principal plane exposed outside, a dielectric layer B which is placed between the above-described dielectric layer A and the above-described dielectric layer D and includes an inner circuit and a first grounding electrode provided on the other principal plane of the above-described dielectric layer A, wherein the above-described dielectric layer A is provided with via holes, and the above-described first grounding electrode and the above-described first shield electrode are electrically connected through the via holes provided on the above-described dielectric layer A.

As described in the above-described Embodiment B1, this configuration can secure a sufficient area of the grounding electrode and has the effect of increasing the grounding strength with respect to the motherboard.

Since the first shield electrode is provided between the inner circuit of the laminated electronic component and the motherboard, it goes without saying that it is possible to secure the shielding function between the above-described inner circuit and the circuit on the motherboard side in the same way as the conventional configuration.

As apparent from the above-described explanations, the laminated electronic component of the present invention has advantages such as suppressing deterioration of characteristics due to parasitic components and improving isolation between shield and external electrodes.

Furthermore, when used as a laminated filter, etc. handling an input signal of 1 GHz or higher, the laminated electronic components of the above-described embodiments have the effect of further suppressing deterioration of high frequency characteristics of a filter circuit, etc., that is, characteristics of selecting frequencies in a high frequency area.

As apparent from the above-described explanations, the present invention has advantages such as sufficiently securing the grounding electrode and increasing grounding strength.

The present invention also has an advantage of having excellent selectivity of frequencies in a high frequency area.

Figure 24:
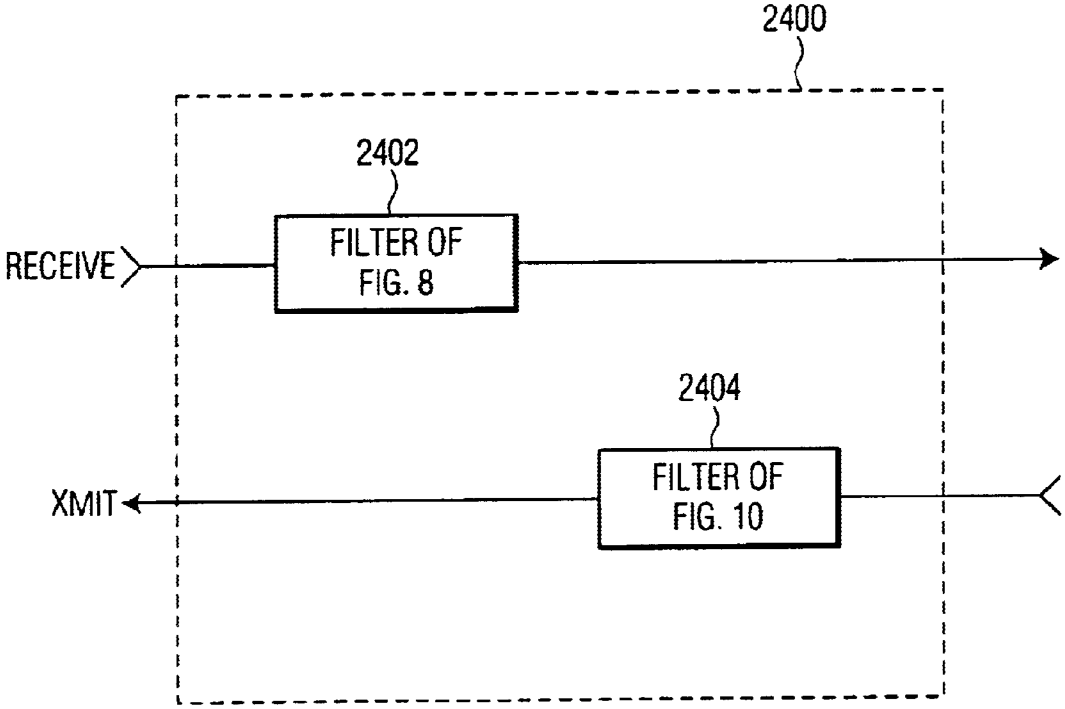
FIG. 24 is a block diagram of a laminated duplexer according to an embodiment of the invention.
Figure 25:
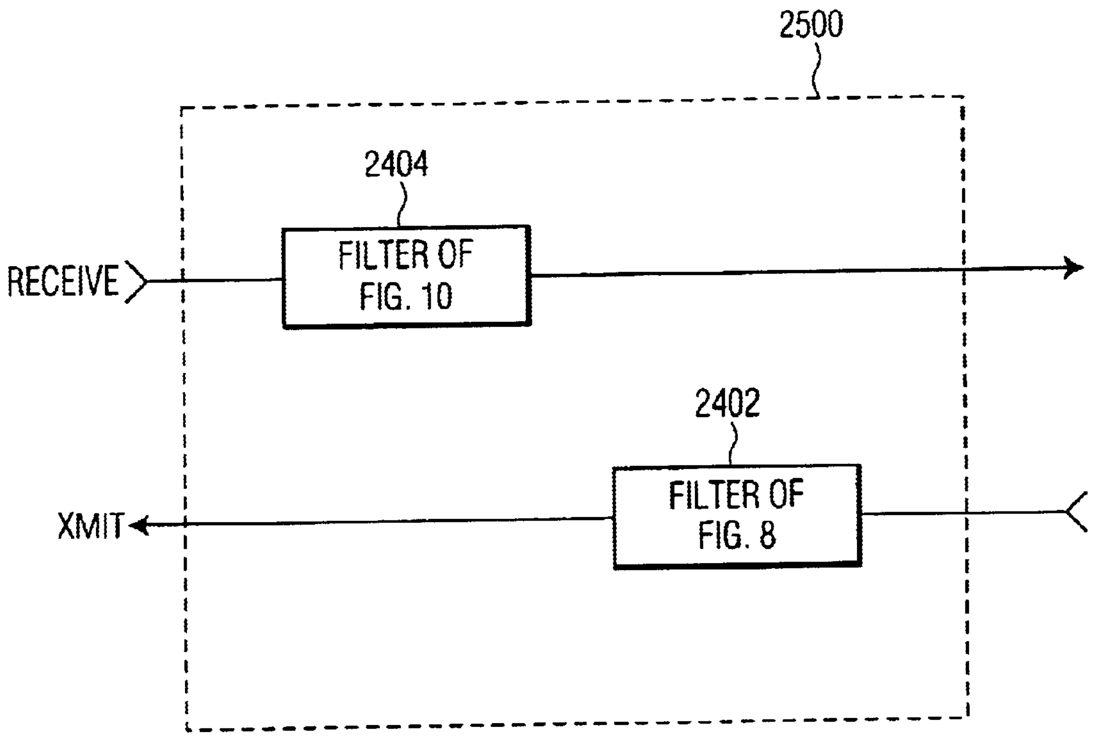
FIG. 25 is a block diagram of a laminated duplexer according to another embodiment of the invention.

FIGS. 24 and 25 are block diagrams of laminated duplexers. Laminated duplexer 2400 includes filter 2402 and filter 2404. Filter 2402 is similar to the filter shown in FIG. 8 and filter 2404 is similar to the filter shown in FIG. 10. As shown, filter 2402 is used in the receiving path and filter 2404 is used in the transmitting path.

FIG. 25 is a block diagram of another laminated duplexer, designated as 2500. As shown, filter 2404, which is similar to the filter of FIG. 10, is used in the receiving path and filter 2402, which is similar to the filter of FIG. 8, is used in the transmitting path.

INDUSTRIAL APPLICABILITY

As described above, when applied to a laminated filter, etc. handling an input signal of 1 GHz or higher, the configuration of the present invention can suppress deterioration of high frequency characteristics of a filter circuit, etc., that is, characteristics of selecting frequencies in a high frequency area.

What is claimed is:

1. A laminated electronic component comprising:

a dielectric layer A provided with a first shield electrode on one principal plane;

a dielectric layer C which is a dielectric layer indirectly placed above said dielectric layer A, provided with a second shield electrode on one principal plane;

a dielectric layer D whose one principal plane is exposed outside;

a dielectric layer B which is placed between said dielectric layer A and said dielectric layer C, and includes an inner circuit; and a first grounding electrode provided on the other principal plane of said dielectric layer A, wherein a via hole is provided in said dielectric layer A, said first shield electrode and said second shield electrode are electrically connected, and said first grounding electrode and said first shield electrode are electrically connected through via holes provided in said dielectric layer A.

2. The laminated electronic component according to claim 1, comprising an end face electrode provided on one side of said laminated electronic component to electrically connect said first shield electrode and said second shield electrode.

3. The laminated electronic component according to claim 2, wherein said dielectric layer B includes a resonator electrode as said inner circuit, said laminated electronic component is provided with a first terminal electrode connected to said resonator electrode, said end face electrode is a second grounding electrode to be connected to a predetermined grounding surface on a substrate on which said laminated electronic component is to be mounted, and said first terminal electrode is provided on sides of said dielectric layer A to dielectric layer D surrounded by said second grounding electrode or electrically connected to said second grounding electrode.

4. The laminated electronic component according to claim 3, wherein said dielectric layer B further includes a coupling electrode as said inner circuit, facing part of said resonator electrode, said laminated electronic component is provided with a second terminal electrode connected to said coupling electrode, and said second terminal electrode is (1) formed on said other principal plane of said dielectric layer A and/or said one principal plane of dielectric layer D in such a way that said second terminal electrode is not electrically connected to said first grounding electrode, and (2) electrically connected to said coupling electrode through a via hole different from said via hole.

5. The laminated electronic component according to claim 3, wherein said resonator electrode s constructed of a transmission line.

6. The laminated electronic component according to claim 1, wherein said first grounding electrode is formed like either a mesh, band or spider's web.

7. The laminated electronic component according to claim 4, wherein said coupling electrode is constructed of a transmission line.

8. The laminated electronic component according to claim 4, wherein said coupling electrode is an inter-stage coupling capacitor electrode constructed of a transmission line.

9. A laminated duplexer comprising:

a transmission filter using the laminated electronic component according to claim 7.

10. A communication device comprising:

a laminated filter using the laminated electronic component according to claim 1.

11. The laminated electronic component according to claim 2, comprising an external terminal electrode which is connected to said inner circuit and has a first height from the bottom surface to the top surface of said laminated electronic component, wherein said end face electrode (1) is a second grounding electrode to connect to a predetermined grounding surface of a substrate on which said laminated electronic component is to be mounted and (2) has a second height from the bottom surface to the top surface of said laminated electronic component, and said first height is different from said second height.

12. The laminated electronic component according to claim 11, wherein said first height from the bottom surface of said laminated body of said external terminal electrode is smaller than said second height from the bottom surface of said laminated body of said second grounding electrode.

13. The laminated electronic component according to claim 12, wherein said second grounding electrode is provided extending from the top surface to the bottom surface of said laminated body.

14. The laminated electronic component according to claim 11, comprising an external shield electrode connected to said second grounding electrode, wherein said external shield electrode is provided on the top surface of said laminated body.

15. The laminated electronic component according to claim 11, comprising a lead-out side electrode connected to said shield electrode, wherein said lead-out side electrode is provided extending at least from the top surface of said laminated body to the area on the side of said laminated body where said external terminal electrode is formed, and the part provided on the side of said laminated body is placed higher than said external terminal electrode viewed from the bottom surface of said laminated body.

16. The laminated electronic component according to claim 11, wherein said lead-out side electrode is connected to said external shield electrode.

17. The laminated electronic component according to claim 11, wherein said second grounding electrodes are placed on both sides of said external terminal electrode.

18. The laminated electronic component according to claim 11, comprising a plurality of said external terminal electrodes, wherein said second grounding electrode is placed between said external terminal electrodes.

19. The laminated electronic component according to claim 15, 17 or 18, wherein said lead-out side electrode is connected to at least one of said second grounding electrodes.

20. The laminated electronic component according to claim 17 or 18, wherein the distance between said external terminal electrode and said second grounding electrode placed next to said external terminal electrode is equal to or greater than the electrode width of said external terminal electrode.

21. The laminated electronic component according to claim 11, wherein said external terminal electrode and said second grounding electrode are buried in said laminated body or exposed outside said laminated body.

22. The laminated electronic component according to claim 11, wherein said dielectric layer includes a crystal phase and glass phase, said crystal phase includes at least one of Al2O3, MgO, SiO2 and ROa (R is at least one element selected from La, Ce, Pr, Nd, Sm and Gd, and a is a numerical value stoichiometrically determined according to the valence of said R).

23. The laminated electronic component according to claim 11, wherein said dielectric layer includes $Bi_2O_3$, $Nb_2O_5$ as main components.

24. A communication device, characterized by using the laminated electronic component according to claim 11.

25. The laminated electronic component according to claim 1, wherein comprising a via hole that penetrates the whole or part of said dielectric layer B and said dielectric layer C to electrically connect said first shield electrode and said second shield electrode.

26. A laminated electronic component comprising:

a laminated body that integrates a plurality of laminated dielectric sheets;

an inner circuit provided on the principal plane of a plurality of dielectric sheets within said laminated body;

a grounding electrode provided on the principal plane of a plurality of dielectric sheets within said laminated body;

a first via hole that penetrates the whole or part of said laminated body and electrically connects the grounding electrodes provided on the principal plane of said plurality of dielectric sheets;

a second via hole that penetrates the whole or part of said laminated body and electrically connects the inner circuits provided on the principal plane of said plurality of dielectric sheets; and an input terminal and output terminal electrically connected to said second via hole, wherein at least one of said grounding electrodes is provided as an exposed grounding electrode which is exposed outside from the principal plane of the dielectric sheet in bottom layer and/or top layer of said dielectric layer, and said input electrode and said output electrode are provided on both sides of said exposed grounding electrode on the same plane as the plane on which said exposed grounding electrode is provided.

27. The laminated electronic component according to claim 26, wherein said grounding electrodes other than said exposed grounding electrode have no exposed parts outside said laminated electronic component.

28. The laminated electronic component according to claim 26, wherein said plurality of dielectric sheets has at least a first dielectric sheet and second dielectric sheet, said plurality of grounding electrodes has at least a first grounding electrode provided on the principal plane of said first dielectric sheet and a second grounding electrode provided on the principal plane of said second dielectric sheet, said second dielectric sheet is placed between said first grounding electrode and said second grounding electrode, and said first via hole at least penetrates said first dielectric sheet and/or said second dielectric sheet and electrically connects said first and second grounding electrodes.

29. The laminated electronic component according to claim 28, wherein said second dielectric sheet is provided in a layer superior to said first dielectric sheet.

30. The laminated electronic component according to claim 29, wherein at least one dielectric sheet with said inner circuit provided on the principal plane is placed between said first dielectric sheet and said second dielectric sheet.

31. The laminated electronic component according to claim 29, wherein said first dielectric sheet and said second dielectric sheet are directly laminated together.

32. The laminated electronic component according to claim 26, wherein said plurality of dielectric sheets includes at least a third dielectric sheet, said plurality of grounding electrodes includes at least a third grounding electrode provided on the principal plane of said third dielectric sheet, and said first via hole at least penetrates said third dielectric sheet and electrically connects said third grounding electrode and said exposed grounding electrode.

33. The laminated electronic component according to claim 32, wherein at least one dielectric sheet with said inner circuit provided on the principal plane is placed between said third dielectric sheet and said dielectric sheet provided with said exposed grounding electrode.

34. The laminated electronic component according to claim 32, wherein said third dielectric sheet and the dielectric sheet provided with said exposed grounding electrode are the same.

35. The laminated electronic component according to claim 26, wherein said dielectric sheet has a thickness of 5 to 50 $\mu$m.

36. The laminated electronic component according to claim 26, wherein said dielectric sheet is made of at least a crystal phase and a glass phase, said crystal phase contains at least one of $Al_2O_3$, MgO, $SiO_2$ and $RO_a$ (R is at least one element selected from La, Ce, Pr, Nd, Sm and Gd, and a is a numerical value stoichiometrically determined according to the valence of said R).

37. The laminated electronic component according to claim 26, wherein said dielectric sheet contains $Bi_2O_3$ and $Nb_2O_5$.

38. A high frequency radio device, mounting the laminated electronic component according to any one of claim 26 to claim 37.

39. A laminated electronic component comprising:

a dielectric layer A provided with a first shield electrode on one principal plane;

a dielectric layer D whose at least one principal plane is exposed outside;

a dielectric layer B which is placed between said dielectric layer A and said dielectric layer D and includes an inner circuit; and a first grounding electrode provided on the other principal plane of said dielectric layer A, wherein a via hole is provided in said dielectric layer A, and said first grounding electrode and said first shield electrode are electrically connected through said via hole provided on said dielectric layer A.

40. A laminated duplexer comprising a reception filter using the laminated electronic component of claim 8.

41. A communication device comprising a laminated duplexer according to claim 9.

* * * * *

UNITED STATES PATENT AND TRADEMARK OFFICE

CERTIFICATE OF CORRECTION

PATENT NO. : 6,822,534 B2 
DATED : November 23, 2004
INVENTOR(S) : Kazuhide Uriu et al.

It is certified that error appears in the above-identified patent and that said Letters Patent is hereby corrected as shown below:

Title page,
Item [75], Inventors, delete "Katano" and insert -- Osaka --, (all occurences), delete "Yao" and insert -- Osaka --, delete "Hirakata" and insert -- Osaka --, delete "Jyoyo" and insert -- Kyoto -- and delete "Kobe" and insert -- Hyogo --.
Item [56], References Cited, FOREIGN PATENT DOCUMENT, delete "JP 05-275003" and insert -- JP 05-275903 --

Column 27,
Line 26, "$\varepsilon_r 5$" should read -- $\varepsilon_r = 5$ --
Line 29, "$\varepsilon_r 50$" should read -- $\varepsilon_r = 50$ --

Column 31,
Line 54, "s" should read -- is --.

Signed and Sealed this

Twenty-sixth Day of April, 2005

JON W. DUDAS
*Director of the United States Patent and Trademark Office*